US008124976B2

(12) United States Patent
Takeda et al.

(10) Patent No.: US 8,124,976 B2
(45) Date of Patent: Feb. 28, 2012

(54) SEMICONDUCTOR DEVICE AND METHOD OF MANUFACTURING THE SAME

(75) Inventors: Koichi Takeda, Minato-ku (JP); Kiyoshi Takeuchi, Minato-ku (JP)

(73) Assignee: NEC Corporation, Tokyo (JP)

( * ) Notice: Subject to any disclaimer, the term of this patent is extended or adjusted under 35 U.S.C. 154(b) by 678 days.

(21) Appl. No.: 12/095,663

(22) PCT Filed: Dec. 1, 2006

(86) PCT No.: PCT/JP2006/324102
§ 371 (c)(1),
(2), (4) Date: May 30, 2008

(87) PCT Pub. No.: WO2007/063990
PCT Pub. Date: Jun. 7, 2007

(65) Prior Publication Data
US 2010/0289091 A1  Nov. 18, 2010

(30) Foreign Application Priority Data

Dec. 2, 2005 (JP) ................................. 2005-349578

(51) Int. Cl.
*H01L 27/11* (2006.01)
(52) U.S. Cl. ...... 257/69; 257/68; 257/903; 257/E21.661; 257/E27.1; 365/156; 365/154; 365/63
(58) Field of Classification Search .................. 257/207, 257/208, 211, 903, E21.661, E27.098; 365/154, 365/63
See application file for complete search history.

(56) References Cited

U.S. PATENT DOCUMENTS 6,469,328 B2* 10/2002 Yanai et al. .................. 257/207
7,830,703 B2* 11/2010 Takeda et al. ................ 365/154
(Continued)

FOREIGN PATENT DOCUMENTS

JP        64-008670 A      1/1989
(Continued)

OTHER PUBLICATIONS

Fu-Liang Yang, et al.; "A 65nm Node Strained SOI Technology with Slim Spacer"; IEEE; International Electron Devices Meeting; Technical Digest; 2003; pp. 627-630.
(Continued)

*Primary Examiner* — Zandra Smith
*Assistant Examiner* — Tsz Chiu
(74) *Attorney, Agent, or Firm* — Sughrue Mion, PLLC

(57) ABSTRACT

The present invention provides a semiconductor device including SRAM cell units each including a data holding section made up of a pair of driving transistors and a pair of load transistors, a data write section made up of a pair of access transistors, and a data read section made up of an access transistor and a driving transistor, wherein each of the transistors includes a semiconductor layer projecting upward from a base plane, a gate electrode extending from a top to opposite side surfaces of the semiconductor layer so as to stride the semiconductor layer, a gate insulating film between the gate electrode and the semiconductor layer, and source/drain areas, a longitudinal direction of each of the semiconductor layers is provided along a first direction, and for all the corresponding transistors between the SRAM cell units adjacent to each other in the first direction, the semiconductor layer in one of the corresponding transistors is located on a center line of the semiconductor layer along the first direction in the other transistor.

17 Claims, 16 Drawing Sheets

U.S. PATENT DOCUMENTS

| | | |
|---|---|---|
| 2002/0024049 A1 * | 2/2002 | Nii et al. ............................ 257/67 |
| 2003/0185044 A1 | 10/2003 | Nii |
| 2003/0202412 A1 * | 10/2003 | Nii et al. ......................... 365/210 |
| 2004/0120209 A1 * | 6/2004 | Lee et al. ................... 365/230.05 |
| 2004/0218455 A1 | 11/2004 | Nii |

FOREIGN PATENT DOCUMENTS

| | | |
|---|---|---|
| JP | 02-263473 A | 10/1990 |
| JP | 04-015951 A | 1/1992 |
| JP | 2002-118255 A | 4/2002 |
| JP | 2003-115551 A | 4/2003 |
| JP | 2003-229575 A | 8/2003 |
| JP | 2003-297953 A | 10/2003 |
| JP | 2004-335535 A | 11/2004 |
| JP | 2005-142289 A | 6/2005 |
| WO | 2005/036651 A1 | 4/2005 |
| WO | 2005/119763 A1 | 12/2005 |
| WO | 2005/119764 A1 | 12/2005 |

OTHER PUBLICATIONS

T. Park, et al.; "Static Noise Margin of the Full DG-CMOS SRAM Cell Using Bulk FinFETs (Omega MOSFETs)"; IEEE; International Electron Devices Meeting; Technical Digest; 2003; pp. 27-30.

Jeong-Hwan Yang, et al.; "Fully Working 1.25 µm² 6T-SRAM Cell with 45nm Gate Length Triple Gate Transistors"; IEEE; International Electron Devices Meeting; Technical Digest; 2003; pp. 23-26.

E. J. Nowak, et al.; "A Functional FinFET-DGCMOS SRAM Cell"; IEEE; International Electron Devices Meeting; Technical Digest; 2002; pp. 411-414.

* cited by examiner (a)

(b)

SEMICONDUCTOR DEVICE AND METHOD OF MANUFACTURING THE SAME

TECHNICAL FIELD

The present invention relates to a semiconductor device and a method of manufacturing the semiconductor device, in particular, to a semiconductor storage device comprising a SRAM (Static Random Access Memory), and a method of manufacturing the semiconductor storage device.

BACKGROUND ART

A SRAM memory cell that is a semiconductor storage element includes a basic structure described below.

As shown in a circuit diagram in FIG. 1, the SRAM memory cell is composed of a flip flop circuit as an information accumulating section, and a pair of access transistors A1 and A2 that controls the electric conduction between the flip flop circuit and data lines (bit lines BL1 and BL2) through which information is written and read. The flip flop circuit is composed of, for example, a pair of CMOS inverters. Each of the CMOS inverters is composed of one driving transistor D1 (D2) and one load transistor L1 (L2).

One of a source area and a drain area of the access transistor A1 (A2) is connected to drains of a load transistor L1 (L2) and a driving transistor D1 (D2). The other of the source area and drain area of the access transistor A1 (A2) is connected to the bit line BL1 (BL2). Furthermore, the paired access transistors A1 and A2 each constitute a part of a word line WL and are connected together.

Gates of the driving transistor D1 and load transistor L1 constituting one of the CMOS inverters are connected to drains (accumulation nodes N2) of the driving transistor D2 and load transistor L2 constituting the other CMOS inverter. Furthermore, gates of the driving transistor D2 and load transistor L2 constituting the latter CMOS inverter are connected to the drains (accumulation nodes N1) of the driving transistor D1 and load transistor L1 constituting the former CMOS inverter. Thus, between the paired CMOS inverters, the I/O section of one of the CMOS inverters and the gate of the other CMOS inverter are cross-coupled together via a pair of wires I1 and I2 called local wires.

A reference voltage (Vss, for example, GND) is supplied to source areas of the driving transistors D1 and D2. A power supply voltage (VDD) is supplied to source areas of the load transistors L1 and L2.

The SRAM cell described above has excellent element characteristics; the SRAM cell is resistant to noise and requires only low power consumption during standby. However, the SRAM cell requires six transistors for each memory cell, a large number of wires, and separation of p-type MOS elements from n-type MOS elements in the same cell. Thus, the SRAM cell is disadvantageously likely to have a large cell area. Furthermore, with the conventional SRAM cell, stored data may be destroyed during a read operation owing to an increased variation in transistor characteristics resulting from miniaturization of the transistors. In the conventional SRAM cell, the word line WL is set to a high level to energize the access transistors A1 and A2; accordingly the accumulation nodes N1 and N2 are connected to the bit lines BL1 and BL2, respectively, so that the levels of the accumulation nodes N1 and N2 change to the respective bit line levels. For example, if the storage in the accumulation node N1 is at a low level, although the bit line BL slightly raises the level of the accumulation node N1, the driving transistor D1 is on and the potential is lowered. However, if the increased potential exceeds the threshold level of the opposite driving transistor D2, the driving transistor D2 is turned on to lower the level of the accumulation node N2 and to reduce an on current for the driving transistor D1. Thus, the level of the accumulation node N1 further rises to destroy the stored data. In general, for the SRAM cell, a static noise margin (SNM) is used as an indicator for measuring the stability of data retention observed when the SRAM cell is accessed. When the SNM is higher than 0 V, a normal read operation is performed. When the SNM is lower than 0 V, during the read operation, the stored data is overwritten with inverted data and thus destroyed.

On the other hand, as a kind of MIS field effect transistor (hereinafter referred to as an "FET"), what is called an FIN FET has been proposed. The FIN FET includes a semiconductor portion shaped like a rectangular parallelepiped and projecting perpendicularly to a substrate plane, and a gate electrode extending from one side surface of the rectangular parallelepiped-shaped semiconductor portion to the opposite surface across a top surface of the portion so as to stride it. A gate insulating film is interposed between the rectangular parallelepiped-shaped semiconductor portion and the gate electrode. Channels are formed mainly along the opposite side surfaces of the rectangular parallelepiped-shaped semiconductor portion. In the FIN FET, channel width is perpendicular to the substrate plane. This is advantageous for miniaturization and advantageously improves various characteristics, for example, improves cutoff characteristic and carrier mobility and reduces a short channel effect and punch-through.

As such an FIN FET, Patent Document 1 (Japanese Patent Laid-Open No. 64-8670) discloses a MOS field effect transistor characterized by including a semiconductor portion which includes a source area, a drain area, and a channel area and which is shaped like a rectangular parallelepiped having a side surface almost perpendicular to the plane of a wafer substrate, the rectangular parallelepiped-shaped semiconductor portion having a height greater than the width thereof, the MOS field effect transistor further including a gate electrode extending perpendicularly to the plane of the wafer substrate.

Patent Document 1 illustrates a form in which the rectangular parallelepiped-shaped semiconductor portion partly constitutes a part of the silicon wafer substrate and a form in which the rectangular parallelepiped-shaped semiconductor portion partly constitutes a part of a single-crystal silicon layer in an SOI (Silicon On Insulator) substrate. The former form is shown in FIG. 2(a), and the latter form is shown in FIG. 2(b).

In the form shown in FIG. 2(a), a part of a silicon wafer substrate 101 constitutes a rectangular parallelepiped-shaped portion 103. A gate electrode 105 extends from one side to the other side of the rectangular parallelepiped-shaped portion 103 across the top thereof. Areas of the rectangular parallelepiped-shaped portion 103 which correspond to the opposite sides of the gate electrode form a source area and a drain area. A channel is formed under an insulating film 104 located under the gate electrode. Channel width is equal to twice as large as the height h of the rectangular parallelepiped-shaped portion 103. Gate length corresponds to the width L of the gate electrode 105. The rectangular parallelepiped-shaped portion 103 is formed by forming a groove in the silicon wafer substrate 101 by means of anisotropic etching so as to leave a part of the silicon wafer substrate 101 inside the groove unprocessed. Furthermore, the gate electrode 105 is provided on an insulating film 102 left in the groove, so as to extend across the rectangular parallelepiped-shaped portion 103.

In the form shown in FIG. 2(b), an SOI substrate is provided which is made up of a silicon wafer substrate 111, an insulating layer 112, and a silicon single-crystal layer. The silicon single-crystal layer is patterned to form a rectangular parallelepiped-shaped portion 113. A gate electrode 115 is provided on the exposed insulating layer 112 so as to extend across the rectangular parallelepiped-shaped portion 113. Areas of the rectangular parallelepiped-shaped portion 113 which correspond to the opposite sides of the gate electrode form a source area and a drain area. A channel is formed under an insulating film 114 located under the gate electrode. The channel width is equal to the sum of double the height a of the rectangular parallelepiped-shaped portion 113 and the width b thereof. The gate length corresponds to the width L of the gate electrode 115.

On the other hand, Patent Document 2 (Japanese Patent Laid-Open No. 2002-118255) discloses an FIN FET including a plurality of rectangular parallelepiped-shaped semiconductor portions (protruding semiconductor layers 213), for example, as shown in FIGS. 3(a) to 3(c). FIG. 3(b) is a sectional view taken along a line B-B in FIG. 3(a). FIG. 2(c) is a sectional view taken along line C-C in FIG. 3(a). The FIN FET includes a plurality of protruding semiconductor layers 213 composed of parts of a well layer 211 in a silicon substrate 210 and arranged parallel to one another. The FIN FET also includes a gate electrode 216 extending across central portions of the protruding semiconductor layers. The gate electrode 216 is formed so as to extend from a top surface of an insulating layer 214 along side surfaces of the protruding semiconductor layers 213. An insulating film 218 is interposed between each of the protruding semiconductor layers and the gate electrode. A channel 215 is formed in a part of the protruding semiconductor layer which is located under the gate electrode. Furthermore, a source/drain area 217 is formed in each of the protruding semiconductor layers. A high-concentration impurity layer (punch-through stopper layer) is provided in an area 212 under the source/drain area 217. Upper layer wires 229 and 230 are provided via an inter-layer insulating film 226 and connected to the source/drain area 207 and the gate electrode 216 by contact plugs 228. Patent Document 2 describes that this structure enables the side surfaces of the protruding semiconductor layer to be used as the channel width, allowing a reduction in planar area compared to conventional planar FETs.

In recent years, attempts have been made to apply this FIN FET to the SRAM. For example, Patent Document 3 (Japanese Patent Laid-Open No. 2-263473) describes that the FIN FET is applied to some of the transistors (which use word lines as gates) in a SRAM memory cell. Furthermore, Non-patent Document 1 (Fu-Liang Yang et al, IEDM (International Electron Devices Meeting), 2003, p. 627 to 630) shows the applicability of the FIN FET to the SRAM. Non-patent Document 2 (T. Park et al, IEDM, 2003, p. 27 to 30) and Non-patent Document 3 (Jeong-Hwan Yang et al, IEDM, 2003, p. 23 to 26) describe examples in which the FIN FET is applied to the SRAM.

The FIN FET has a higher ratio of on current to off current than conventional bulk transistors. Thus, SNM can be slightly improved by applying the FIN FET to the SRAM. However, if transistors are further miniaturized, then even with the FIN FET, it is very difficult for the six-transistor configuration of the conventional SRAM to prevent the SNM from disadvantageously becoming lower than 0 V. This may limit miniaturization.

DISCLOSURE OF THE INVENTION

An object of the present invention is to provide a semiconductor device which comprises a SRAM using a FIN FET and which operates stably even with a possible increase in variation resulting from miniaturization, the semiconductor device having a dense structure that is easy to manufacture.

The present invention provides a semiconductor device and a method of manufacturing the semiconductor device described below.

(1) A semiconductor device including SRAM cell units each including a data holding section including a pair of a first driving transistor and a second driving transistor and a pair of a first load transistor and a second load transistor, a data write section including a pair of a first access transistor and a second access transistor, and a data read section including a third access transistor and a third driving transistor, wherein each of the transistors includes a semiconductor layer projecting upward from a base plane, a gate electrode extending from a top to opposite side surfaces of the semiconductor layer so as to stride the semiconductor layer, a gate insulating film interposed between the gate electrode and the semiconductor layer, and a pair of a source area and a drain area provided in the semiconductor layer;

a longitudinal direction of each of the semiconductor layers is provided along a first direction; and for all the corresponding transistors between the SRAM cell units adjacent to each other in the first direction, the semiconductor layer in one of the corresponding transistors is located on a center line of the semiconductor layer along the first direction in the other transistor.

(2) A semiconductor device including SRAM cell units each including a data holding section including a pair of a first driving transistor and a second driving transistor and a pair of a first load transistor and a second load transistor, a data write section comprising a pair of a first access transistor and a second access transistor, and a data read section comprising a third access transistor and a third driving transistor, wherein each of the transistors includes a semiconductor layer projecting upward from a base plane, a gate electrode extending from a top to opposite side surfaces of the semiconductor layer so as to stride the semiconductor layer, a gate insulating film interposed between the gate electrode and the semiconductor layer, and a pair of a source area and a drain area provided in the semiconductor layer;

the semiconductor layers are arranged such that a longitudinal direction of each of the semiconductor layers is provided along a first direction and a distance between center lines of the semiconductor layers along the first direction is an integral multiple of a minimum one of the distances between the center lines;

the semiconductor layer s have an equal width in a second direction which is parallel to the base plane and is perpendicular to the first direction; and for all the corresponding transistors between the SRAM cell units adjacent to each other in the first direction, the semiconductor layer in one of the corresponding transistors is located on a center line of the semiconductor layer along the first direction in the other transistor.

(3) The semiconductor device according to item 2, wherein in the SRAM cell unit, the first driving transistor includes the semiconductor layer located on the center line of the semiconductor layer along the first direction in the first access transistor, and the second driving transistor includes the semiconductor layer located on the center line of the semiconductor layer along the first direction in the second access transistor;

the first load transistor includes the semiconductor layer adjacent to the semiconductor layer in the first driving transistor, and the second load transistor includes the semiconductor layer adjacent to the semiconductor layer in the second driving transistor; and the first load transistor and the second load transistor are arranged such that the distance between the center line of the semiconductor layer in the first load transistor and the center line of the semiconductor layer in the second load transistor is equal to the minimum distance.

(4) The semiconductor device according to item 2, wherein in the SRAM cell unit, the first load transistor includes the semiconductor layer located on the center line of the semiconductor layer along the first direction in the first access transistor, and the second load transistor includes the semiconductor layer located on the center line of the semiconductor layer along the first direction in the second access transistor:

the first driving transistor includes the semiconductor layer adjacent to the semiconductor layer in the first load transistor, and the second driving transistor includes the semiconductor layer adjacent to the semiconductor layer in the second load transistor, and the first driving transistor and the second driving transistor are arranged such that the distance between the center line of the semiconductor layer in the first driving transistor and the center line of the semiconductor layer in the second driving transistor is equal to the minimum distance.

(5) The semiconductor device according to item 2, 3, or 4, wherein the distance between the center lines of the adjacent semiconductor layers in the first driving transistor and the first load transistor, the center lines being along the first direction is at least twice as large as the minimum distance; and the distance between the center lines of the adjacent semiconductor layers in the second driving transistor and the second load transistor, the center lines being along the first direction is at least twice as large as the minimum distance.

(6) The semiconductor device according to any one of items 2 to 5, wherein the access transistor in one of the SRAM cell units adjacent to each other in a second direction is located adjacent to the access transistor in the other SRAM cell unit; and the distance between the center line of the semiconductor layer along the first direction in one of the access transistors and the center line of the semiconductor layer along the first direction in the other access transistor is at least twice as large as the minimum distance.

(7) The semiconductor device according to any one of items 2 to 6, wherein each of the semiconductor layers constituting the transistors in the SRAM cell unit is made of a semiconductor layer provided on an insulating layer.

(8) The semiconductor device according to item 7, wherein in the SRAM cell unit, the first driving transistor includes the semiconductor layer integrated with the semiconductor layer in the first access transistor and the semiconductor layer in the first load transistor, and the second driving transistor includes the semiconductor layer integrated with the semiconductor layer in the second access transistor and the semiconductor layer in the second load transistor.

(9) The semiconductor device according to item 7, wherein the SRAM cell unit includes, on the insulating layer, a first semiconductor layer area integrated with the semiconductor layer in the first driving transistor, the semiconductor layer in the first load transistor, and the semiconductor layer in the first access transistor, the first semiconductor layer area including a junction between a first conductivity type area and a second conductivity type area, and a second semiconductor layer area integrated with the semiconductor layer in the second driving transistor, the semiconductor layer in the second load transistor, and the semiconductor layer in the second access transistor, the second semiconductor layer area including a junction between a first conductivity type area and a second conductivity type area; and a first node contact connected to a drain area of the first driving transistor and to a drain area of the first load transistor is connected onto the first semiconductor layer area, and a second node contact connected to a drain area of the second driving transistor and to a drain area of the second load transistor is connected onto the second semiconductor layer area.

(10) The semiconductor device according to item 1, wherein in the SRAM cell unit, each of the semiconductor layers constituting the transistors is made of a semiconductor layer provided on the insulating layer, and the first driving transistor includes the semiconductor layer integrated with the semiconductor layer in the first access transistor and the semiconductor layer in the first load transistor, and the second driving transistor includes the semiconductor layer integrated with the semiconductor layer in the second access transistor and the semiconductor layer in the second load transistor.

(11) The semiconductor device according to item 1, wherein each of the semiconductor layers constituting the transistors in the SRAM cell unit is made of a semiconductor layer provided on an insulating layer;

the SRAM cell unit includes, on the insulating layer, a first semiconductor layer area integrated with the semiconductor layer in the first driving transistor, the semiconductor layer in the first load transistor, and the semiconductor layer in the first access transistor, the first semiconductor layer area including a junction between a first conductivity type area and a second conductivity type area, and a second semiconductor layer area integrated with the semiconductor layer in the second driving transistor, the semiconductor layer in the second load transistor, and the semiconductor layer in the second access transistor, the second semiconductor layer area including a junction between a first conductivity type area and a second conductivity type area; and a first node contact connected to the drain area of the first driving transistor and to a drain area of the first load transistor is connected onto the first semiconductor layer area, and the second node contact connected to a drain area of the second driving transistor and to a drain area of the second load transistor is connected onto the second semiconductor layer area.

(12) The semiconductor device according to any one of items 1 to 6, wherein each of the semiconductor layers constituting the transistors in the SRAM cell unit is made of a part of a semiconductor substrate and projects from a top surface of a separating insulating film provided on the semiconductor substrate.

(13) The semiconductor device according to any one of items 1 to 12, wherein in the SRAM cell unit, the gate electrode of the first driving transistor, the gate electrode of the first load transistor, and the gate electrode of the third driving transistor are formed of a first wire along the second direction perpendicular to the first direction, and a gate electrode of the second driving transistor and a gate electrode of the second load transistor are formed of a second wire along the second direction, and the gate electrode of the first access transistor is formed of a third wire located on a center line of the second wire along the second direction, and the gate electrode of the second access transistor is formed of a fourth wire located on a center line of the first wire along the second direction.

(14) The semiconductor device according to any one of items 1 to 13, wherein a ground line contact connected to the source area of the first driving transistor, a power supply line contact connected to the source area of the first load transistor, and a bit line contact connected to the source/drain area of the second access transistor are arranged on one line of one cell unit boundary along the second direction, and a ground line contact connected to the source area of the second driving transistor, a power supply line contact connected to the source area of the second load transistor, and a bit line contact connected to the source/drain area of the first access transistor are arranged on one line of the other cell unit boundary along the second direction.

(15) The semiconductor device according to any one of items 1 to 14, wherein each of the ground line contacts, the power supply line contacts, and the bit line contacts has a second-direction width greater than that of the semiconductor layer under the gate electrode, and is connected onto a pad semiconductor layer integrated with the semiconductor layer.

(16) The semiconductor device according to any one of items 1 to 15, wherein the adjacent SRAM cell units are in a mirror image relationship with respect to the cell unit boundary serving as a symmetry axis.

(17) A method of manufacturing a semiconductor device including SRAM cell units each including a data holding section including a pair of a first driving transistor and a second driving transistor and a pair of a first load transistor and a second load transistor, a data write section including a pair of a first access transistor and a second access transistor, and a data read section including a third access transistor and a third driving transistor, wherein each of the transistors includes a semiconductor layer projecting upward from a base plane, a gate electrode extending from a top to opposite side surfaces of the semiconductor layer so as to stride the semiconductor layer, a gate insulating film interposed between the gate electrode and the semiconductor layer, and a pair of a source area and a drain area provided in the semiconductor layer, the method including:

patterning a semiconductor layer to form a semiconductor layer pattern including a striped pattern in which long semiconductor layers extending in a first direction and having an equal width in a second direction perpendicular to the first direction are arranged at equal intervals;

removing a part of the striped pattern;

forming a gate insulating film on side surfaces of the remaining long semiconductor layers;

depositing a gate electrode material and patterning the gate electrode material deposited film to form a gate electrode extending from a top to opposite side surfaces of each of the long semiconductor layers along the second direction so as to stride the long semiconductor layer; and introducing impurities into each long semiconductor layer to form source/drain areas.

(18) The method of manufacturing the semiconductor device according to item 17, wherein the semiconductor layer pattern is formed to be line symmetric to each of four sides of a rectangular unit boundary corresponding to a SRAM unit boundary serving as a symmetry axis.

(19) The method of manufacturing the semiconductor device according to item 17 or 18, wherein in the formation of the semiconductor layer pattern, a band-like pattern is formed, the band-like pattern crossing the long semiconductor layers and having a first-direction width greater than the second-direction width of each of the long semiconductor layers; and in the removal of a part of the striped pattern, a part of the band-like pattern is also removed to form a pad semiconductor layer having a second-direction width greater than a second-direction width of each of the long semiconductor layers for connecting a contact connected with an upper layer wire to the pad semiconductor layer.

(20) The method of manufacturing the semiconductor device according to item 17, 18, or 19, further comprising forming a cap insulating layer on the semiconductor layer, wherein the semiconductor layer and the cap insulating layer are patterned to form the semiconductor layer pattern with the cap insulating layer formed thereon.

(21) The method of manufacturing the semiconductor device according to any one of items 17 to 20, wherein the semiconductor layer provided on a base insulating layer is patterned to form the semiconductor layer pattern provided on the base insulating layer.

(22) The method of manufacturing the semiconductor device according to any one of items 17 to 20, further comprising patterning a semiconductor substrate as the semiconductor layer to form the semiconductor layer pattern and then forming a separating insulating layer on the semiconductor substrate, and removing a top surface-side part of the separating insulating portion to expose the semiconductor layer pattern so that the semiconductor layer pattern projects upward from the remaining separating insulating layer.

According to the present invention, data reading elements are added to a related SRAM cell to enable a sharp reduction in the possibility of data destruction associated with a read operation. Thus, for example, even with an increase in variation among FIN FETs, a semiconductor device can be provided which includes a SRAM structure capable of a stable read operation. Moreover, since the number of elements to be added for the read operation is two, a dense semiconductor device that is easy to manufacture can be provided.

BEST MODE FOR CARRYING OUT THE INVENTION

[Configuration of a FIN FET]

Figure 1:
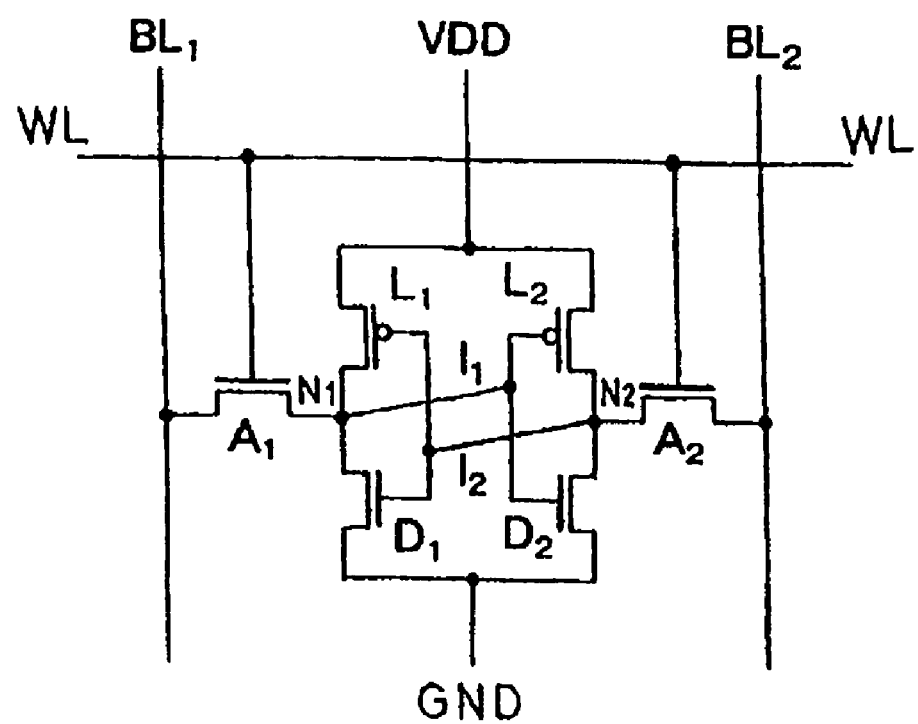
FIG. 1 is a circuit diagram of a SRAM.
Figure 2:
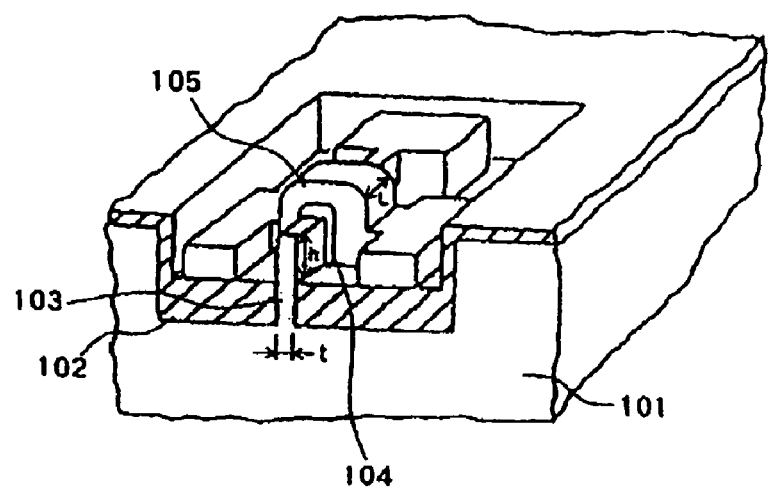
FIG. 2 is a diagram illustrating element structures of conventional FIN FETs.
Figure 2:
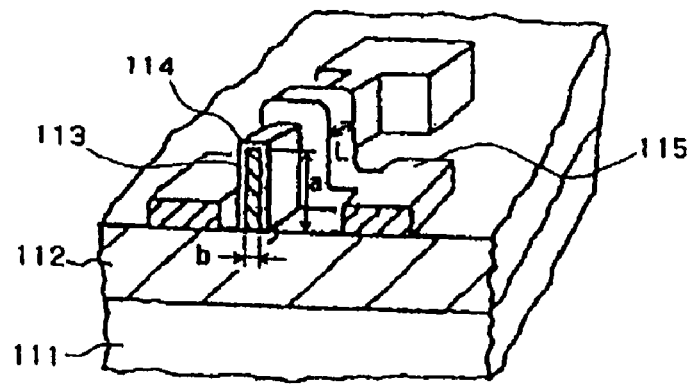
Figure 3:
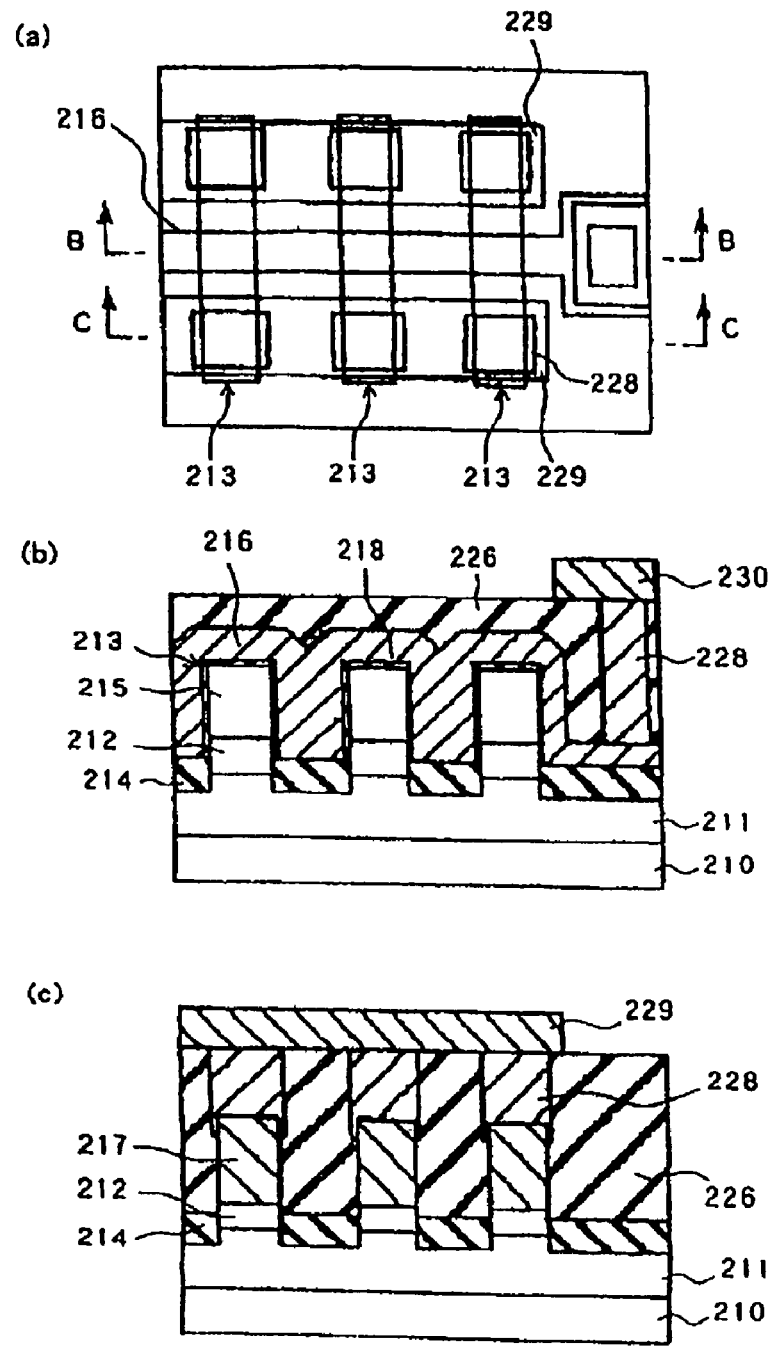
FIG. 3 is a diagram illustrating an element structure of a conventional FIN FET.
Figure 4:
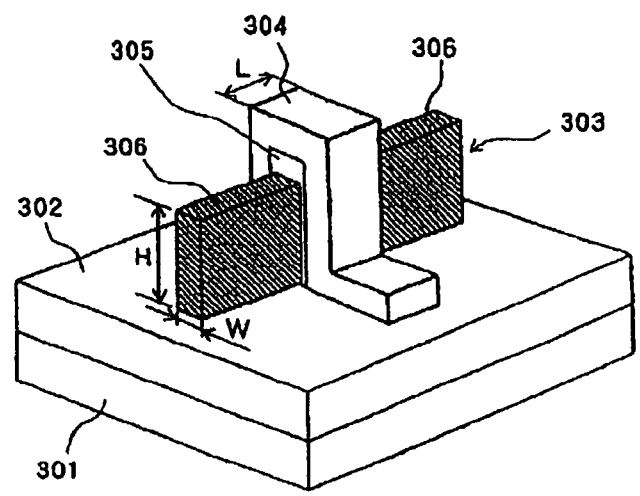
FIG. 4 is a diagram of an element structure of a FIN FET applied to the present invention.

A FIN FET applied to a SRAM structure according to the present invention, a field effect transistor can be used which includes a semiconductor layer 303 projecting perpendicularly to and upward from a base plane, a gate electrode 304 extending from the top thereof to opposite side surfaces of the semiconductor layer so as to stride the semiconductor layer, a gate insulating film 305 interposed between the gate electrode 304 and the semiconductor layer 303, and a source/drain area 306 formed in the semiconductor layer 303, for example, as shown in FIG. 4.

The semiconductor layer provided on a base insulating film 302 on a semiconductor substrate 301, for example, as shown in FIG. 4, may be used as a semiconductor layer (hereinafter appropriately referred to as a projecting semiconductor layer) projecting perpendicularly to and upward from a base plane constituting a FIN FET. In the present invention, the base plane means any surface parallel to the substrate, and in this case, a surface of the base insulating film. The base insulating film itself may be a substrate. Furthermore, as described below, the semiconductor substrate can be patterned to form semiconductor patterns so that a part of the semiconductor layer which projects upward from a surface of a separating insulating layer provided between the semiconductor patterns can be utilized as a projecting semiconductor layer in the FIN FET. The configuration of the latter allows heat and charges generated in the semiconductor layer as a result of driving of elements to escape to the semiconductor substrate. This advantageously allows heat to be radiated and inhibits a substrate floating effect. The projecting semiconductor layer in the FIN FET may be shaped substantially like a rectangular parallelepiped according to processing accuracy. However, the shape of the projecting semiconductor layer may be different from the rectangular parallelepiped provided that the semiconductor layer offers desired element characteristics.

In the FIN FET according to the present invention, the gate electrode extends from the top to opposite side surfaces of the projecting semiconductor layer so as to stride the projecting semiconductor layer, and the gate insulating film is interposed between the gate electrode and the projecting semiconductor layer. Impurities of a relatively low concentration are introduced into a part of the projecting semiconductor layer under the gate electrode according to a predetermined threshold voltage. A voltage is applied to the gate electrode to form a channel. The channel can be formed on the opposite side surfaces of the projecting semiconductor layer by allowing the insulating film interposed between each side surface (the surface perpendicular to the base plane) of the projecting semiconductor layer and the gate electrode to function as a gate insulating film. A configuration in which no channel is formed on a top surface of the projecting semiconductor layer can be formed by providing a thick cap insulating film between the top surface of the projecting semiconductor layer and the gate electrode. On the other hand, a configuration in which the channel can also be formed on the top surface of the projecting semiconductor layer can also be formed by providing an insulating film as thin as the gate insulating film provided on the side surface, between the top surface of the projecting semiconductor layer and the gate electrode.

Here, a channel length direction is a longitudinal direction of the projecting semiconductor layer 303, that is, the direction of a gate length L. The source/drain area 306 is generally formed of a diffusion layer in which concentrated impurities are introduced in the projecting semiconductor layer 303 on the opposite sides of the gate electrode. Alternatively, the source/drain area may be formed of metal so as to constitute what is called a Schottky source/drain transistor.

The FIN FET in the present invention may have what is called a multi-structure in which a plurality of projecting semiconductor layers are provided parallel to one another in one transistor and in which a conductor wire provided so as to stride the plurality of projecting semiconductor layers constitutes a gate electrode. The element structure of each of the projecting semiconductor layer is similar to that described above. In connection with the uniformity of the element characteristics and processing accuracy, the projecting semiconductor layers preferably have an equal width W (the width parallel to a substrate plane and perpendicular to the channel length direction).

In the Fin MISFET according to the present invention, the main channel is preferably formed on the opposite side surfaces of the projecting semiconductor layer. Furthermore, the width W of the projecting semiconductor layer under the gate electrode is preferably completely depleted by depletion layers formed from the respective side surfaces of the semiconductor layer during operation. This configuration advantageously improves cutoff characteristics and carrier mobility and reduces the substrate floating effect. In the element structure providing this configuration, the width W of the projecting semiconductor layer under the gate electrode is preferably at most twice as large as the height H of the semiconductor layer or is equal to or smaller than the gate length L. Specifically, in connection with processing accuracy, strength, and the like, the width W of the projecting semiconductor layer under the gate electrode is preferably set to at least 5 nm and more preferably at least 10 nm. On the other hand, to form a dominant channel on each of the side surfaces of the semiconductor layer and to provide a completely depleted structure, the width W is preferably set to at most 60 nm and more preferably at most 30 nm.

The specific dimensions and the like of the FIN FET in the present invention can be appropriately set within the following ranges. For example, the width W of the projecting semiconductor layer is 5 to 100 nm, and the height H of the projecting semiconductor layer is 20 to 200 nm. The gate length L is 10 to 100 nm, and the thickness of the gate insulating film is 1 to 5 nm (in the case of $SiO_2$). The concentration of impurities in a channel formation area is 0 to $1\times10^{19}$ $cm^{-3}$, and the concentration of impurities in the source/drain area is $1\times10^{19}$ to $1\times10^{21}$ $cm^{-3}$. The height H of the projecting semiconductor layer means the length of a part of the semiconductor layer which is perpendicular to the substrate plane, the part projecting upward from a surface of the base insulating film or a surface of the separating insulating film. The channel formation area refers to a part of the projecting semiconductor layer located under the gate electrode.

In the element structure described above, a material for the base insulating film or separating insulating film is not particularly limited provided that the material offers a desired insulating property. The material may be, for example, $SiO_2$, $Si_3N_4$, AlN, a metal oxide such as alumina, or an organic insulating material.

Single-crystal silicon may be preferably used as a semiconductor forming the projecting semiconductor layer in the FIN FET.

A silicon substrate may be used as the substrate under the base insulating film. However, the present invention is not limited to the silicon substrate but can be constructed provided that an insulator is located under the projecting semiconductor layer. For example, a structure may be used in which the insulator itself under the semiconductor layer constitutes a support substrate as in the case of an SOS (Silicon on Sapphire, Silicon on Spinel). Besides the SOS, the insulating support substrate may be quartz or an AlN substrate. The semiconductor layer can be provided on the support substrate by an SOI (Silicon on Insulator) manufacturing technique (laminating process or film thinning process).

A conductor having a desired conductivity and a desired work function can be used as a material for the gate electrode in the present invention. The material may be, for example, an impurity-doped semiconductor such as polycrystal silicon, polycrystal SiGe, polycrystal Ge, or polycrystal SiC, metal such as Mo, W, or Ta, metal nitride such as TiN or WN, or a silicide compound such as cobalt silicide, nickel silicide, platinum silicide, or erbium silicide. The structure of the gate electrode may be a single-layer film, or a laminate structure such as a laminate film of a polycrystal silicon film and a metal film, a laminate film of metal films, or a laminate film of a polycrystal silicon film and a silicide film.

As the gate insulating film in the present invention, an $SiO_2$ film or an SiON film, or what is called a high-dielectric insulating film (High-K film) may be used. The High-K film may be, for example, a metal oxide film such as a $Ta_2O_5$ film, an $Al_2O_3$ film, an $La_2O_3$ film, an $HfO_2$ film, or a $ZrO_2$ film, or composite metal oxide indicated by a composition formula such as HfSiO, ZrSiO, HfAlO, or ZrAlO. The gate insulating film may have a laminate structure, and may be, for example, a laminate film obtained by forming a silicon-containing oxide film such as $SiO_2$ or HfSiO on the semiconductor layer such as silicon and providing the High-K film on the silicon-containing oxide film.

[Circuit Configuration of the SRAM Cell Unit]

Figure 5:
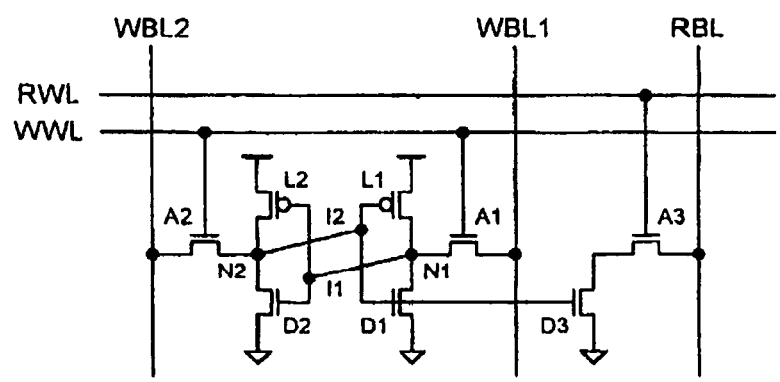
FIG. 5 is a circuit diagram of an element structure of a SRAM cell unit according to the present invention.

The SRAM memory cell unit preferable for the present invention includes a circuit shown in a circuit diagram in FIG. 5. The SRAM memory cell unit includes a total of eight transistors arranged therein, that is, paired driving transistors D1 and D2, paired load transistors L1 and L2, paired access transistors A1 and A2, a driving transistor D3, and an access transistor A3. The paired driving transistors D1 and D2, the paired access transistors A1 and A2, the driving transistor D3, and the access transistor A3 are first conductive type (for example, n channel type) field effect transistors. The paired load transistors L1 and L2 are second conductive type (for example, p channel type) field effect transistors.

The paired driving transistors D1 and D2 and the paired load transistors L1 and L2 constitute a flip flop circuit as an information accumulating section that stores 1-bit information. The flip flop circuit is composed of paired CMOS inverters each composed of one driving transistor D1 (D2) and one load transistor L1 (L2).

One of a source and a drain of the access transistor A1 (A2) is connected to drains of the load transistor L1 (L2) and the driving transistor D1 (D2). The other is connected to a write-only bit line WBL1 (WBL2). Gates of the paired access transistors A1 and A2 are connected to a write-only word line WWL.

Gates of the driving transistor D1 and load transistor L1 constituting one of the CMOS inverters are connected to drains (accumulation node N2) of the driving transistor D2 and load transistor L2 constituting the other CMOS inverter. Gates of the driving transistor D2 and load transistor L2 constituting the latter CMOS inverter are connected to drains (accumulation node N1) of the driving transistor D1 and load transistor L1 constituting the former CMOS inverter. In this manner, the I/O section (accumulation node) of one of the paired CMOS inverters and the gate of the other CMOS inverter are cross-coupled together via paired wires I1 and I2 called local wires.

A reference voltage (for example, GND) is supplied to sources of the driving transistors D1 and D2. A power supply voltage (VDD) is supplied to sources of the load transistors L1 and L2. The driving transistor D3 and the access transistor A3 are connected in series. A drain of the access transistor A3 is connected to a read-only bit line RBL. A source of the driving transistor D3 is connected to GND. A gate of the access transistor A3 is connected to a read-only word line RWL. A gate of the driving transistor D3 is connected to one (for example, N2) of the accumulation nodes.

[Element Structure of the SRAM]

Figure 6:
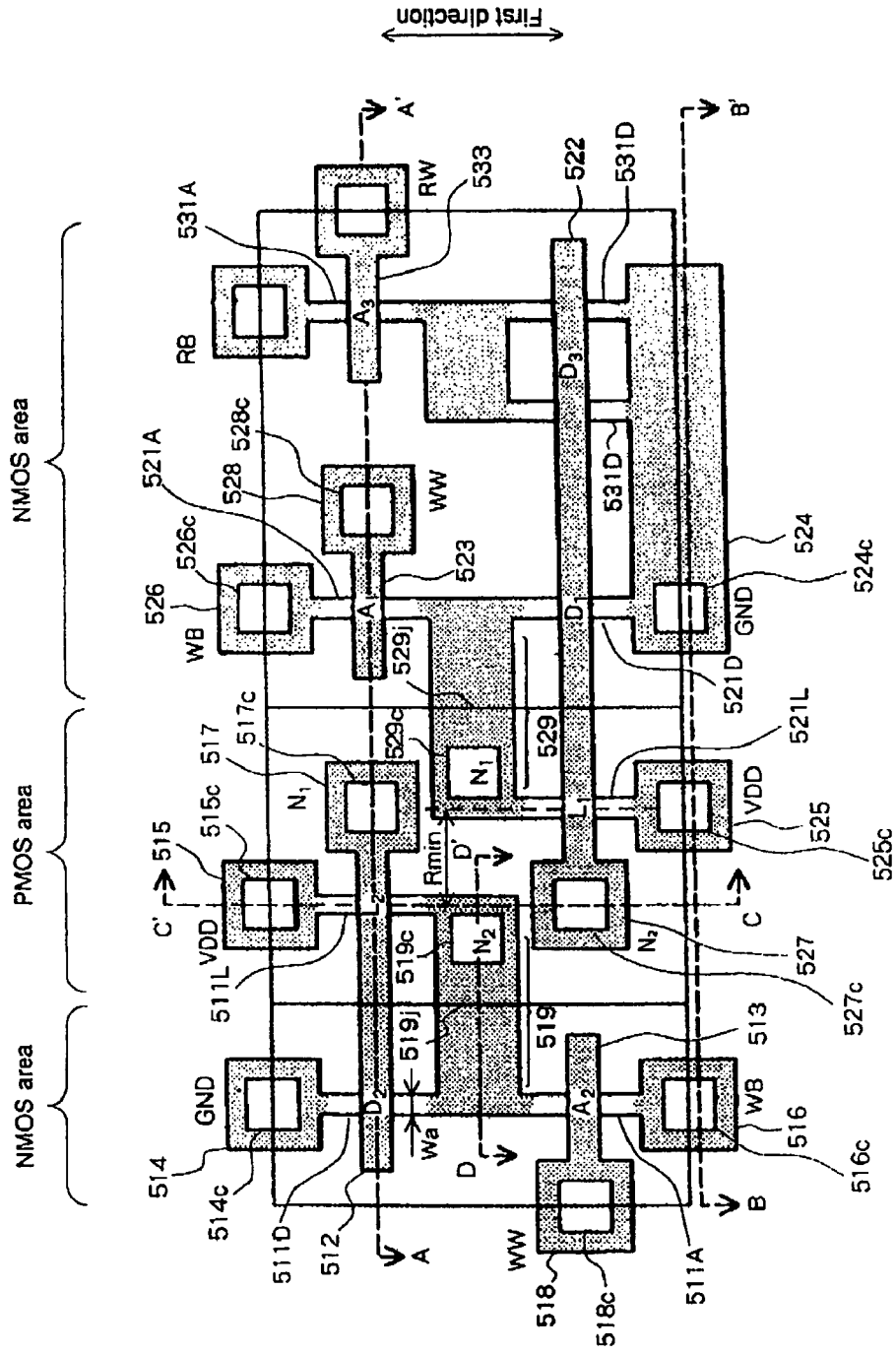
FIG. 6 is a plan view of the element structure of the SRAM cell unit according to the present invention.
Figure 7:
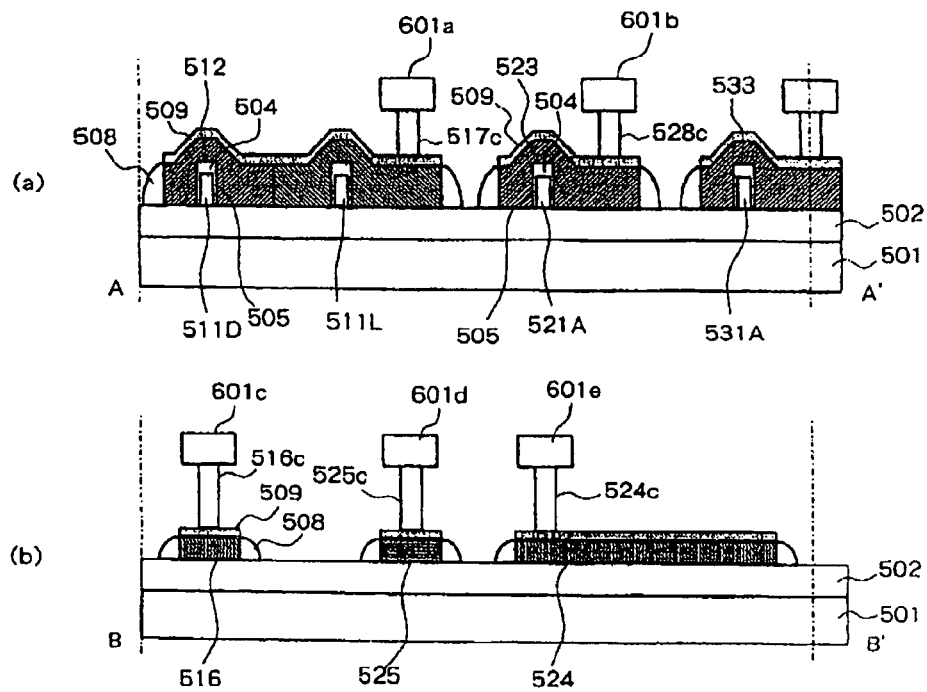
FIG. 7 is a diagram (sectional view) of the element structure of the SRAM cell unit according to the present invention.

FIGS. 6 and 7 show an example of the element structure of the SRAM cell unit. FIG. 6 is a plan view, and FIG. 7(a) is a sectional view taken along line A-A'. FIG. 7(b) is a sectional view taken along line B-B', and FIG. 7(c) is a sectional view taken along line C-C'. In FIG. 6, a side wall insulating film 508 is omitted. Vertical dashed lines in the right and left of each of FIGS. 7(a) to 7(c) show cell unit boundaries.

As shown in FIG. 6, in the cell unit boundaries the n-channel type driving transistors D1, D2, and D3, the p-channel type load transistors L1 and L2, and the n-channel type access transistors A1, A2, and A3 are arranged on an insulating layer 502 provided on a semiconductor substrate 501 so as to constitute the circuit in FIG. 5. A semiconductor layer portion in an nMOS area is an n-type area. A semiconductor layer portion in a pMOS area is a p-type area.

One of the driving transistors, that is, the driving transistor D2, includes a projecting semiconductor layer 511D, a gate electrode 512 extending from the top to opposite side surfaces of the projecting semiconductor layer 511D so as to stride the projecting semiconductor layer 511D, a gate insulating film 505 interposed between the gate electrode 512 and the projecting semiconductor layer 511D, and a source/drain area formed in the projecting semiconductor layer 511D on each of the opposite sides of gate electrode (FIG. 7(a)). In this example, a cap insulating film 504 is provided between the top of the projecting semiconductor layer and the gate electrode. No channel is formed on a top surface of the projecting semiconductor layer. Each of the other transistors similarly has the cap insulating layer. The other driving transistor D1 includes a projecting semiconductor layer, a gate electrode 522 extending from the top to opposite side surfaces of the projecting semiconductor layer so as to stride the projecting semiconductor layer, the gate insulating film 505 interposed between the gate electrode 522 and the projecting semiconductor layer 521D, and a source/drain area provided on each of the opposite gate electrode sides of the projecting semiconductor layer 521D. The other driving transistor D3 includes a projecting semiconductor layer 531D, a gate electrode 533 extending from the top to opposite side surfaces of the projecting semiconductor layer 531D so as to stride the projecting semiconductor layer, a gate insulating film interposed between the gate electrode and the projecting semiconductor layer, and a source/drain area provided on each of the opposite gate electrode sides of the projecting semiconductor layer.

One of the load transistors, that is, the load transistor L2, includes a projecting semiconductor layer 511L, a gate electrode 512 extending from the top to opposite side surfaces of the projecting semiconductor layer 511L so as to stride the projecting semiconductor layer 511L, a gate insulating film 505 interposed between the gate electrode 512 and the projecting semiconductor layer 511L, and a source/drain area provided on each of the opposite gate electrode sides of the projecting semiconductor layer 511L (FIGS. 7(a) and 7(c)). The other load transistor L1 includes a projecting semiconductor layer 521L, a gate electrode 522 extending from the top to opposite side surfaces of the projecting semiconductor layer 521L so as to stride the projecting semiconductor layer, a gate insulating film interposed between the gate electrode and the projecting semiconductor layer, and a source/drain area provided on each of the opposite gate electrode sides of the projecting semiconductor layer.

One of the access transistors, that is, the access transistor A2, includes a projecting semiconductor layer 511A, a gate electrode 513 extending from the top to opposite side surfaces of the projecting semiconductor layer 511A so as to stride the projecting semiconductor layer 511A, a gate insulating film interposed between the gate electrode 513 and the projecting semiconductor layer 511A, and a source/drain area provided on each of the opposite gate electrode sides of the projecting semiconductor layer 511A. The access transistor A1 includes a projecting semiconductor layer 521A, a gate electrode 523 extending from the top to opposite side surfaces of the projecting semiconductor layer 521A so as to stride the projecting semiconductor layer, the gate insulating film 505 interposed between the gate electrode and the projecting semiconductor layer, and a source/drain area provided on each of the opposite gate electrode sides of the projecting semiconductor layer (FIG. 7(a)). The access transistor A3 includes a projecting semiconductor layer 531A, a gate electrode 533 extending from the top to opposite side surfaces of the projecting semiconductor layer 531A so as to stride the projecting semiconductor layer, a gate insulating film interposed between the gate electrode and the projecting semiconductor layer, and a source/drain area provided on each of the opposite gate electrode sides of the projecting semiconductor layer (FIG. 7(a)).

The access transistors A1 and A3 use the write-only word line WWL and a read-only word line RWL, respectively for gate input. A gate contact pad for the write word line WWL needs to be located between the transistors. In this case, a certain distance is preferably set between the access transistors A1 and A3. On the other hand, the same signal N2 is input to the driving transistors D1 and D3, connected in series with the access transistors A1 and A3, respectively. A free area corresponding to the gate contact pad is thus created between the transistors. Consequently, one FIN FET can be added to the free area to allow the driving transistor D3 to be composed of two FIN FETs without increasing the area of the SRAM cell unit as shown in FIG. 6. Therefore, although the driving transistor D3 can be composed of one FIN FET, the driving transistor D3 is desirably composed of two FIN FETs in view of the efficient utilization of the cell area.

Figure 8:
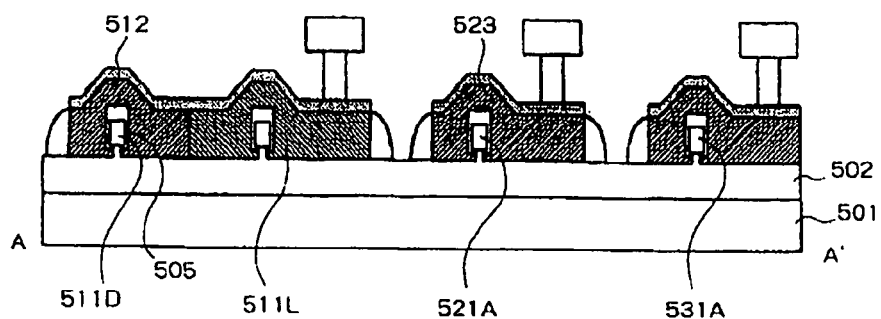
FIG. 8 is a diagram (sectional view) of another element structure of the SRAM cell unit according to the present invention.

Each of the transistors constituting the SRAM may have a structure shown in FIG. 8. FIG. 8 shows a sectional structure corresponding to FIG. 7(a). In this structure, the gate insulating film and a gate electrode are formed so as to reach a bottom surface of the projecting semiconductor layer. This structure allows the bottom surface of the projecting semiconductor layer to be also utilized as a channel, enabling the driving capability of the transistor to be improved. This structure can be obtained by, for example, isotropically etching the insulating layer 502 with fluorinated acid or the like, using the projecting semiconductor layer as a mask, to retract the insulating layer at the bottom of the projecting semiconductor layer, and then forming the gate insulating film and the gate electrode.

The longitudinal direction (channel length direction) of the projecting semiconductor layer constituting each of the transistors in the SRAM cell is provided along a first direction (the vertical direction of FIG. 6, that is, the direction of line C-C'). For all the corresponding transistors between the SRAM cell units adjoining to each other in the first direction, the projecting semiconductor layer in one of the transistors is located on a center line of the other transistor along the first direction. This structure enables a dense SRAM cell unit to be formed, providing a SRAM structure that is easy to manufacture and can be accurately formed.

The source area of the driving transistor D2 is connected to the ground line (GND) via a contact plug 514c that connects to a pad semiconductor layer 514 formed integrally with the projecting semiconductor layer 511D. On the other hand, the drain area of the driving transistor D2 is connected to the gate electrodes 522 of the driving transistor D1 and the load transistor L1 via a contact plug 519c that connects to a first node semiconductor layer 519 formed integrally with the projecting semiconductor layer 511D.

The source area of the load transistor L2 is connected to the power supply line VDD (upper layer wire 601g) via a contact plug 515c that connects to a pad semiconductor layer 515 formed integrally with the projecting semiconductor layer 511L. On the other hand, the drain area of the load transistor L2 is connected to the gate electrodes 522 of the driving transistor D1 and the load transistor L1 via the contact plug 519c that connects to the first node semiconductor layer 519 formed integrally with the projecting semiconductor layer 511L.

One of the source and drain areas of the access transistor A2 is connected to the bit line WBL2 (upper layer wire 601c) via a contact plug 516c that connects to a pad semiconductor layer 516 formed integrally with the projecting semiconductor layer 511A. On the other hand, the other of the source and drain areas of the access transistor A2 is connected to the gate electrodes 522 of the driving transistor D1 and the load transistor L1 via the contact plug 519c that connects to the first node semiconductor layer 519 formed integrally with the projecting semiconductor layer 511A.

The source area of the driving transistor D1 is connected to the ground line GND (upper layer wire 601e) via a contact plug 524c that connects to a pad semiconductor layer 524 formed integrally with the projecting semiconductor layer 521D. The ground contact pad 524 is shared by the transistors D1 and D3. On the other hand, the drain area of the driving transistor D1 is connected to the gate electrodes 512 of the driving transistor D2 and the load transistor L2 via a contact plug 529c that connects to a second node semiconductor layer 529 formed integrally with the projecting semiconductor layer 521D.

The source area of the load transistor L1 is connected to the power supply line VDD (upper layer wire 601d) via a contact plug 525c that connects to a pad semiconductor layer 525 formed integrally with the projecting semiconductor layer

521L. On the other hand, the drain area of the load transistor L1 is connected to the gate electrodes 512 of the driving transistor D2 and the load transistor L2 via the contact plug 529c that connects to the second node semiconductor layer 529 formed integrally with the projecting semiconductor layer 521L.

One of the source and drain areas of the access transistor A1 is connected to the bit line WBL1 via a contact plug 526c that connects to a pad semiconductor layer 526 formed integrally with the projecting semiconductor layer 521A. The other of the source and drain areas of the access transistor A1 is connected to the gate electrodes 512 of the driving transistor D2 and the load transistor L2 via the contact plug 529c that connects to the second node semiconductor layer 529 formed integrally with the projecting semiconductor layer 521A.

The gate electrodes of the driving transistor D2 and load transistor L2 are composed of the common gate wire 512 and are connected to the second node semiconductor layer 529 via a contact plug 517c connected to a pad electrode 517 having a width greater than that (gate length L) of the gate electrode and via an upper layer wire 601a.

The gate electrodes of the driving transistor D1, load transistor L1, and driving transistor D3 are composed of the common gate wire 522 and connected to the first node semiconductor layer 519 via a contact plug 527c connected to a pad electrode 527 having a width greater than that (gate length L) of the gate electrode and via an upper layer wire 601f.

The gate electrode 513 of the access transistor A2 is located such that a longitudinal center line of the gate electrode 513 is located to align with a longitudinal center line of the gate wire 522. The gate electrode 513 is connected to the word line WWL via a contact plug 518c connected to a pad electrode 518 having a width greater than that (gate length) of the gate electrode.

The gate electrode 523 of the access transistor A1 is located such that a longitudinal center line of the gate electrode 523 is located to align with a longitudinal center line of the gate wire 512. The gate electrode 523 is connected to the word line WWL (upper layer wire 601b) via a contact plug 528c connected to a pad electrode 528 having a width greater than that (gate length) of the gate electrode.

In the SRAM structure according to the present invention, the adjacent SRAM cell units are preferably in a mirror image relationship in which the cell unit boundary is a symmetry axis. That is, the layout of semiconductor layer patterns constituting the projecting semiconductor layers, wiring patterns constituting the gate electrodes, and contacts, between the adjacent SRAM cell units is in a line symmetry relationship (mirror inversion) in which the four sides of the cell unit boundary are each a symmetry axis.

The above-described configuration enables the formation of a dense SRAM structure that is easy to manufacture and can be accurately formed. However, a layout shown in FIG. 6 and described below provides a SRAM structure that is easier to manufacture and can be more accurately formed.

The longitudinal direction (channel length direction) of each of the projecting semiconductor layers constituting the transistors in the SRAM cell unit is preferably provided along the first direction (the vertical direction of FIG. 6, that is, the direction of line C-C'). Furthermore, the projecting semiconductor layers in the SRAM cell unit are preferably arranged such that the distances between the center lines of the projecting semiconductor layers along the first direction each is an integral multiple of the minimum one of the distances between the center lines. The projecting semiconductor layers preferably have an equal width W (Wa). The distance between the center line of the projecting semiconductor layer in one of the load transistors, that is, the load transistor L1, and the center line of the projecting semiconductor layer in the load transistor L2 preferably has the above-described minimum distance Rmin. The center line of the projecting semiconductor layer refers to a line along the longitudinal direction (channel length direction) of the projecting semiconductor layer which line passes through a middle point of the width W (the width parallel to the base plane and perpendicular to the channel length direction) of the projecting semiconductor layer.

In this SRAM structure, for all the corresponding transistors between the SRAM cell units adjoining to each other in the first direction, the center line of the projecting semiconductor layer in one of the transistors and the center line of the projecting semiconductor layer in the other transistor are preferably arranged on one line. However, sufficient effects can be exerted provided that possible misalignment is equal to at most 20% and preferably at most 10% of the minimum distance.

In the SRAM cell unit shown in FIG. 6, one of the driving transistors, that is, the driving transistor D2, includes a semiconductor layer located on the center line of the projecting semiconductor layer in one of the access transistors, that is, the access transistor A2. The other driving transistor D1 includes a semiconductor layer located on the center line of the projecting semiconductor layer in the other access transistor A1. The access transistor A3 includes a semiconductor layer located on the center line of one of the semiconductor layers in the driving transistor D3. One of the load transistors, that is, the load transistor L2, includes a semiconductor layer adjacent to the projecting semiconductor layer in one of the driving transistors, that is, the driving transistor D2. The other load transistor L1 includes a semiconductor layer adjacent to the projecting semiconductor layer in the other driving transistor D1.

In the above-described SRAM unit, the driving transistors and the load transistors may be replaced with the load transistors and the driving transistors respectively. That is, one of the load transistors, that is, the load transistor L2, includes the semiconductor layer located on the center line of the projecting semiconductor layer in one of the access transistors, that is, the access transistor A2. The other load transistor L1 includes the semiconductor layer located on the center line of the projecting semiconductor layer in the other access transistor A1. One of the driving transistors, that is, the driving transistor D2, includes the semiconductor layer adjacent to the projecting semiconductor layer in one of the load transistors, that is, the load transistor L2. The other driving transistor D1 includes the semiconductor layer adjacent to the projecting semiconductor layer in the other load transistor L1. One of the driving transistors, that is, the driving transistor D2, and the other driving transistor D1 are arranged such that the distance between the center line of the projecting semiconductor layer in the driving transistor D2 and the center line of the projecting semiconductor layer in the driving transistor D1 has the minimum distance.

The SRAM cell unit according to the present invention further preferably has a layout described below, for example, as shown in FIG. 6, in order to provide sufficient spaces and contact areas for inter-gate separation and pn separation.

(i) Each of the following distances is at least twice as large as the minimum distance Rmin: distance between the center line of the projecting semiconductor layer in one of the driving transistors, that is, the driving transistor D1, and the center line of the projecting semiconductor layer in one of the load transistors, that is, the load transistor L1, the driving transistor D1 and the load transistor L1 being adjacent to each other, and the distance between the center line of the semiconductor layer in the other driving transistor D2 and the center line of the semiconductor layer in the other load transistor L2, the driving transistor D2 and the load transistor L2 being adjacent to each other.

(ii) For the access transistors adjacent to each other between the SRAM cell units adjoining to each other in a second direction (the lateral direction of FIG. 6; this also applies to the description below) perpendicular to the first direction, the distance between the center line of the semiconductor layer in one of the transistors and the center line of the semiconductor layer in the other transistor is at least twice as large as the minimum distance Rmin.

If these distances are excessively long, the cell unit has a large area. Thus, each of the distances is preferably at most three times as large as the minimum distance Rmin.

Matter (i) makes it possible to provide sufficient spaces for inter-gate separation (the spaces between 517 and 523 and between 513 and 527) and sufficient spaces for pn separation (a space close to 519 and a space close to 529). Furthermore, matter (ii) makes it possible to provide sufficient spaces for word line contact.

Furthermore, when the SRAM cell unit according to the present invention has a contact layout described below, for example, as shown in FIG. 6, a denser SRAM structure that is easier to manufacture can be provided.

That is, the following contacts are preferably arranged on one line of one of the cell unit boundaries along the second direction: the ground line contact 514c, connected to the source area of one of the driving transistors, that is, the driving transistor D2, the power supply line contact 515c, connected to the source area of one of the load transistors, that is, the load transistor L2, and the bit line contact 526c, connected to the source/drain area of one of the access transistors, that is, the access transistor A1. The following contacts are preferably arranged on one line of the other cell unit boundary along the second direction: the ground line contact 524c, connected to the source area of the other driving transistor D1, the power supply line contact 525c, connected to the source area of the other load transistor L1, and the bit line contact 516c, connected to the source/drain area of the other access transistor A2.

In the SRAM structure according to the present exemplary embodiment shown in FIGS. 6 and 7, the projecting semiconductor layer in each of the transistors is provided on the insulating layer 502. This configuration may have a structure described below. That is, for example, as shown in FIG. 6, in the SRAM cell unit, one of the driving transistors, that is, the driving transistor D2, includes the semiconductor layer 511D, formed integrally with the semiconductor layer 511A in one of the access transistors, that is, the access transistor A2, and with the semiconductor layer 511L in one of the load transistors, that is, the load transistor L2. The other driving transistor D1 may include the semiconductor layer 521D formed integrally with the semiconductor layer 521A in the other access transistor A1 and the semiconductor layer 521L in the other load transistor L1. Furthermore, the semiconductor layer 531A in the access transistor A3 and at least one of the semiconductor layers, that is, the semiconductor layer 531D, in the driving transistor D3 may be an integrally formed semiconductor layer.

Moreover, this configuration may include the first node semiconductor layer 519 formed integrally with the semiconductor layer 511D in the driving transistor D2, the semiconductor layer 511L in the load transistor L2, and the semiconductor layer 511A in the access transistor A2, the layer 519 including a pn junction 519j between a p-type area and an n-type area, and the second node semiconductor layer 529 formed integrally with the semiconductor layer 521D in the driving transistor D1, the semiconductor layer 521L in the load transistor L1, and the semiconductor layer 521A in the access transistor A1, the layer 529 including a pn junction 529j between a p-type area and an n-type area.

According to this configuration, the semiconductor layer constituting the projecting semiconductor layer in each of the transistors is provided on the insulating layer. Thus, the direct junction between the p-type area and the n-type area enables the drain of the driving transistor and the drain of the load transistor to be directly connected together. The p-type area and the n-type area can be electrically short-circuited by a silicide layer 509. As a result, the area of the SRAM cell unit can be reduced. In contrast, a structure including a well structure under the semiconductor layer needs to interpose an insulating separation area between the p-type area and the n-type area. The above-described structure eliminates the need for such a separating insulating area. This enables an increase in the density of the SRAM structure.

Furthermore, in this configuration, the node contact 519c, connected to the upper layer wire, is connected onto the first node semiconductor layer 519. The second node contact 529c, connected to the upper layer wire, is connected onto the second node semiconductor layer 529. The first and second node semiconductor layers also function as contact pad layers. Thus, this configuration provides sufficient node contact areas while increasing the density of the SRAM structure.

[Manufacturing Method]

Now, description will be given of a method of manufacturing the SRAM structure shown in FIGS. 6 and 7.

First, an SIO substrate is prepared which includes a buried insulating film (base insulating film) made up of $SiO_2$ and a semiconductor layer provided on the buried insulating film and made up of single-crystal silicon. Then, a sacrifice oxide film is formed on the semiconductor layer in the SIO substrate. Impurities for forming a channel area are implanted in the semiconductor layer via the sacrifice oxide film in ion form. Subsequently, the sacrifice oxide film is removed, and a cap insulating film is formed on the semiconductor layer. The introduction of the impurities for forming the channel area may be performed by oblique ion implantation or Halo implantation following patterning of the semiconductor layer.

Figure 9:
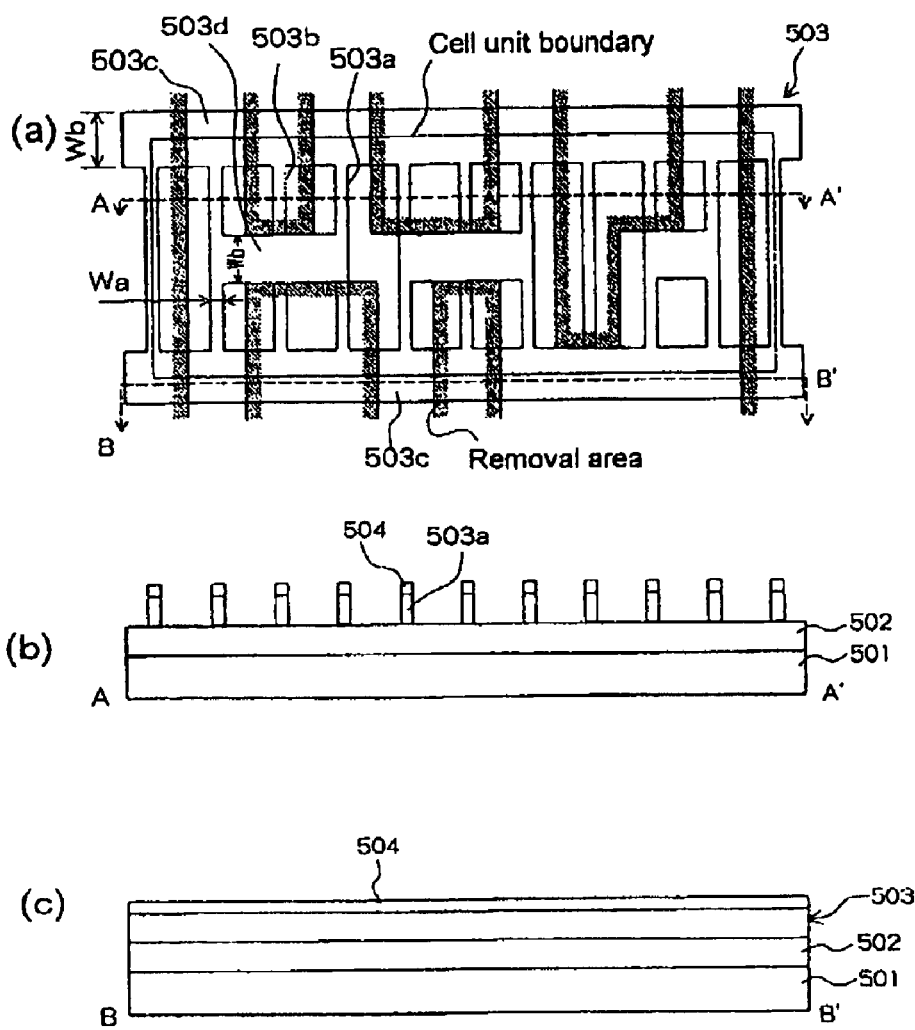
FIG. 9 is a diagram illustrating a method of manufacturing the SRAM structure according to the present invention.

Then, the semiconductor layer and the cap insulating layer formed thereon are patterned by photolithography and dry etching to form a semiconductor layer pattern including a striped pattern portion in which long semiconductor layers are arranged at equal intervals. This is shown in FIG. 9. FIG. 9(a) is a plan view. FIG. 9(b) is a sectional view taken along line A-A'. FIG. 9(c) is a sectional view taken along line B-B'. Shaded areas in FIG. 9(a) show areas from which the semiconductor layer is to be removed in the subsequent step. Reference numeral 501 denotes the semiconductor substrate, and reference numeral 502 denotes the buried insulating film. Reference numeral 503 denotes the semiconductor layer, and reference numerals 503a and 503b denote the long semiconductor layers. Reference numeral 504 denotes the cap insulating layer.

The long semiconductor layer 503a constitutes the projecting semiconductor layer in the FIN FET. The long semiconductor layer 503b is a dummy semiconductor layer to be removed in the subsequent step. The semiconductor layer pattern 503, including the long semiconductor layers 503a and 503b, is formed to be in a line symmetry relationship (mirror inversion) in which the four sides of a cell unit boundary corresponding to SRAM cell unit boundaries are each a symmetry axis. Forming such a very periodic pattern enables a fine pattern to be accurately formed in this pattern area Band-like semiconductor layer portions 503c and 503d orthogonal to the long semiconductor layers 503a and 503b are partly removed during the subsequent step. The remaining part of each of the band-like semiconductor layer portions 503c and 503d constitutes a pad semiconductor layer to contact a contact plug. The pad semiconductor layer for the ground line contact, the power supply line contact, and the bit line contact is formed from the band-like semiconductor layer portion 503c. The pad semiconductor layer for the accumulation node contact is formed from the band-like semiconductor layer portion 503d. The first-direction width Wb of the band-like semiconductor layers is preferably set greater than the second-direction width Wa of the long semiconductor layers.

Figure 10:
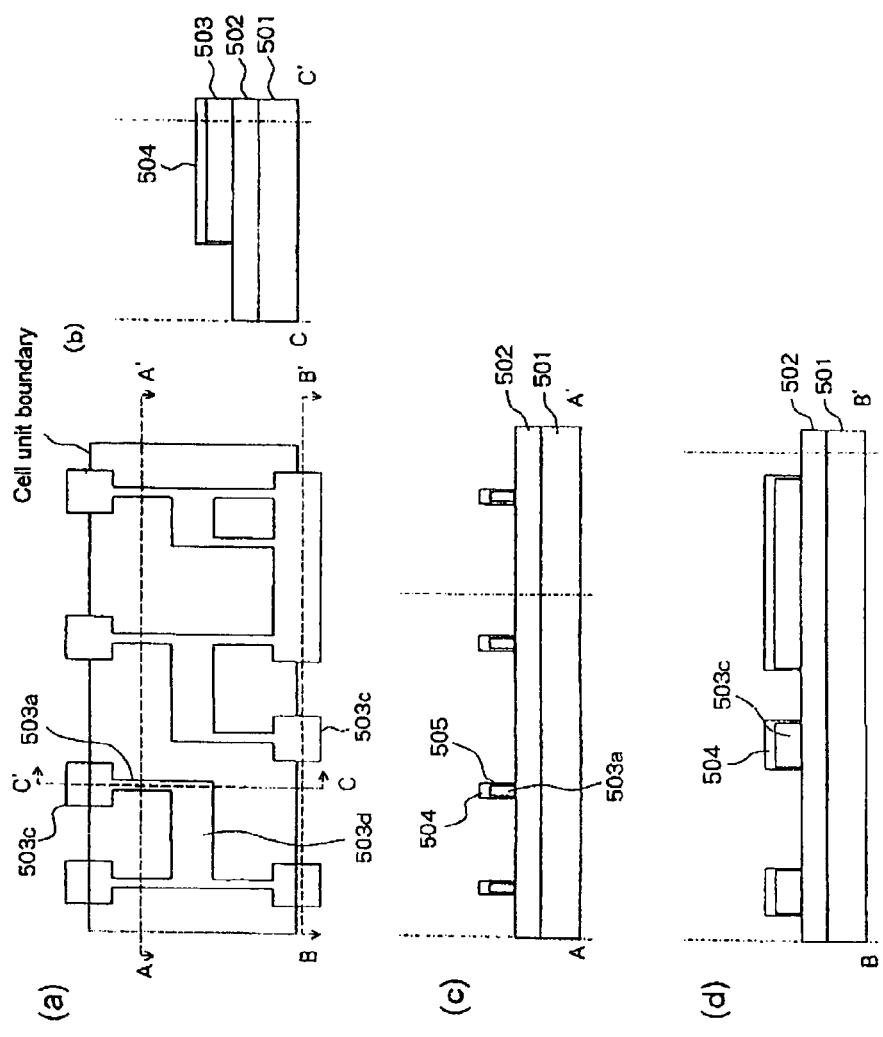
FIG. 10 is a diagram illustrating the method of manufacturing the SRAM structure according to the present invention.

Then, unwanted parts are removed from the semiconductor layer pattern by lithography and dry etching. Subsequently, the gate oxide film 505 is formed on side surfaces of each of the long semiconductor layers by thermal oxidation or the like. This is shown in FIG. 10. FIG. 10(a) is a plan view. FIG. 10(b) is a sectional view taken along line C-C'. FIG. 10(c) is a sectional view taken along line A-A'. FIG. 10(d) is a sectional view taken along line B-B'. Vertical dashed lines in the right and left, respectively, of each of FIGS. 10(b) to 10(d) show the cell unit boundaries.

The remaining long semiconductor layer portions 503a constitute the projecting semiconductor layers in the FIN FETs. The remaining band-like semiconductor layer portions 503c constitute the pad semiconductor layers for the ground line contact, the power supply line contact, and the bit line contact. The remaining band-like semiconductor layer portions 503d constitute the pad semiconductor layers for the accumulation node contacts.

Then, a gate electrode material is deposited, and a gate electrode is formed from the material by lithography and dry etching. For example, polysilicon is deposited, and n-type impurities (phosphorous, arsenic, or the like) and p-type impurities (boron or the like) are doped into an nMOS area and a pMOS area, respectively, by lithography and ion implantation. Gate wires are subsequently formed by lithography and dry etching. Thus, the gate of the n-type polysilicon and the gate of the p-type polysilicon can be formed in the nMOS area and the pMOS area, respectively.

Then, impurities are introduced into the side surfaces of each of the long semiconductor layers by oblique ion implantation to form extension dope areas. At this time, lithography is utilized to introduce the n-type impurities (phosphorous, arsenic, or the like) and the p-type impurities (boron or the like) into the nMOS area and the pMOS area, respectively. In tandem with the ion implantation forming the extension dope areas, Halo implantation may be performed to implant impurities having conductivity types opposite to those of the extension dope areas in ion form.

Figure 11:
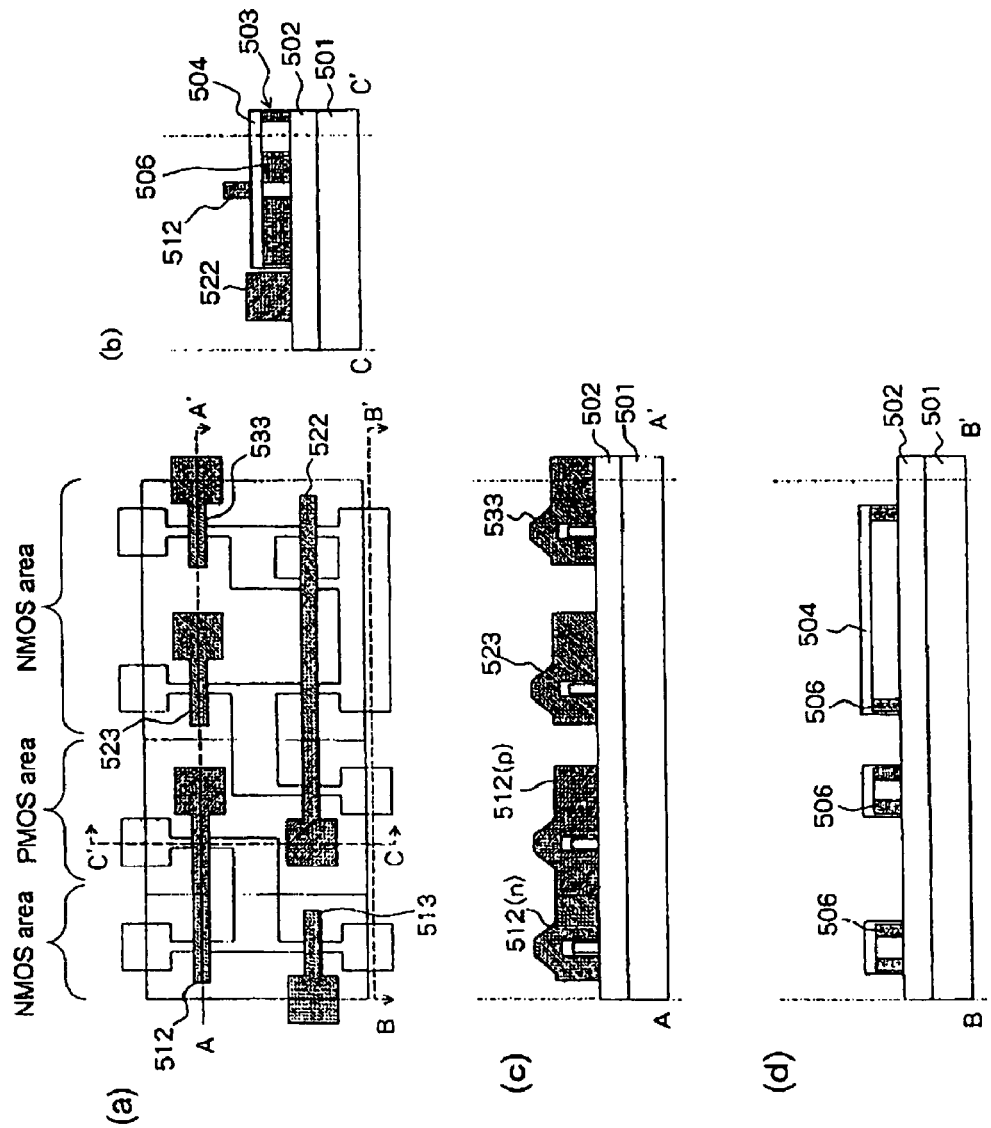
FIG. 11 is a diagram illustrating the method of manufacturing the SRAM structure according to the present invention.

This is shown in FIG. 11. FIG. 11(a) is a plan view. FIG. 11(b) is a sectional view taken along line C-C'. FIG. 11(c) is a sectional view taken along line A-A'. FIG. 11(d) is a sectional view taken along line B-B'. Vertical dashed lines in the right and left, respectively, of each of FIGS. 11(b) to 11(d) show the cell unit boundaries. Reference numerals 512, 513, 522, 523, and 533 denote the gate wires. Reference numeral 506 denotes the extension dope area.

Then, an insulating film is deposited all over the surface of the top layer. Etch-back is performed by anisotropic etching to form side wall insulating films. At this time, the cap insulating film 504 is also etched away to expose the top surface of the semiconductor layer except for the parts located under the side wall insulating films.

Then, ion implantation is performed perpendicularly to the base plane to form source/drain diffusion areas. At this time, lithography is utilized to introduce the n-type impurities (phosphorous, arsenic, or the like) and the p-type impurities (boron or the like) into the nMOS area and the pMOS area, respectively. The extension dope areas not overlapping the source/drain diffusion areas constitute extension areas. What is called an LDD (Lightly Doped Drain) structure is formed.

Figure 12:
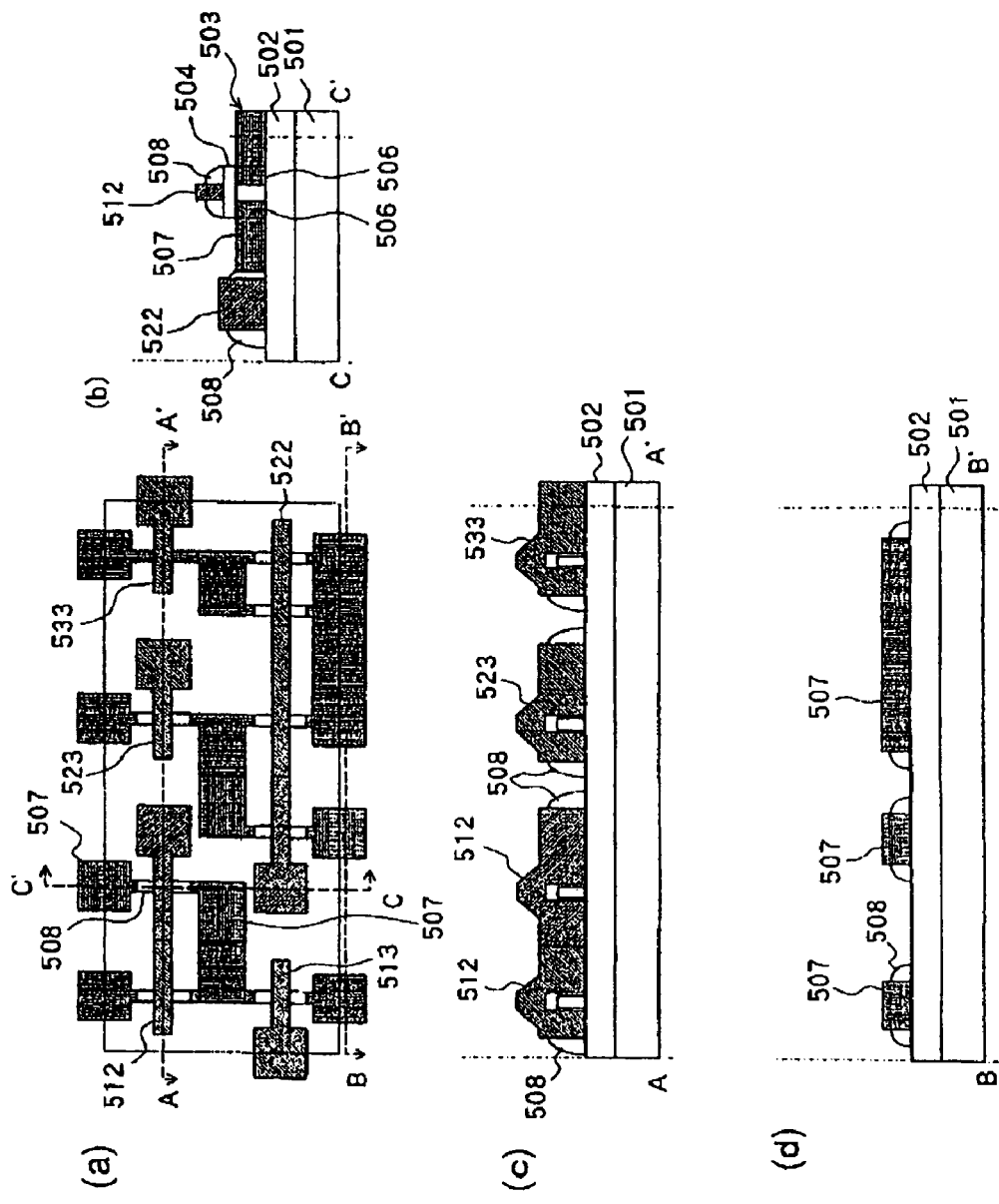
FIG. 12 is a diagram illustrating the method of manufacturing the SRAM structure according to the present invention.

This is shown in FIG. 12. FIG. 12(a) is a plan view. FIG. 12(b) is a sectional view taken along line C-C'. FIG. 12(c) is a sectional view taken along line A-A'. FIG. 12(d) is a sectional view taken along line B-B'. Vertical dashed lines in the right and left, respectively, of each of FIGS. 12(b) to 12(d) show the cell unit boundaries. Reference numeral 508 denotes the side wall insulating film. Reference numeral 506 denotes the extension area. Reference numeral 507 denotes the source/drain diffusion area. FIG. 12(a) shows only parts of the side wall insulating film 508 which overlap the semiconductor projecting areas.

Then, what is called a salicide process is used to form the silicide layer 509 such as nickel silicide on each of the source/drain diffusion areas and on each of the gate wires (gate electrodes). Subsequently, a series of steps including a step of forming an inter-layer insulating film, a step of forming contact plugs, and a step of forming wires are executed at least twice to obtain a predetermined SRAM structure. This is shown in FIGS. 6 and 7, described above. These figures show only one layer of upper layer wires. However, in actuality, a plurality of layers are formed which three-dimensionally cross one another in the vertical and horizontal directions via the inter-layer insulating film.

[Other Examples of the Semiconductor Layer Pattern]

Figure 13A:
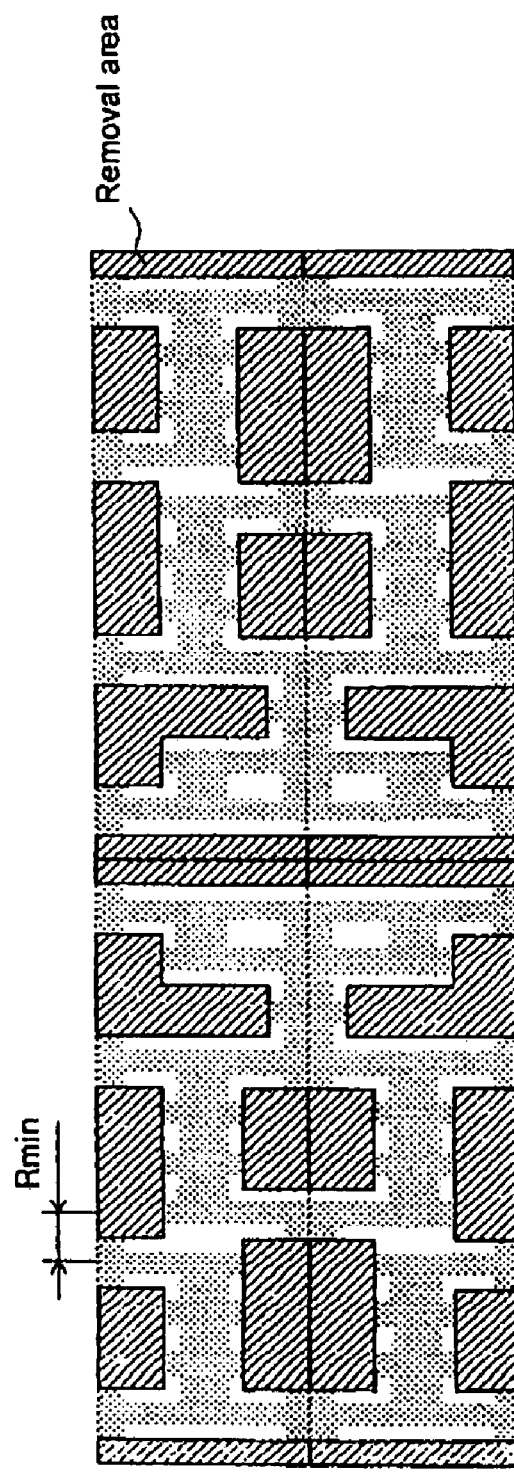
FIG. 13a is a diagram illustrating a method of manufacturing another SRAM structure according to the present invention.

FIG. 13a shows another example of a semiconductor layer pattern corresponding to FIG. 9(a). FIG. 9(a) shows an area corresponding to one SRAM cell unit. However, FIG. 13a shows an area corresponding to a total of four SRAM cell units arranged in two vertical columns and two horizontal rows. Dotted lines in the figure show the cell unit boundaries. Parts covered with shaded patterns are removed in a removal step. Dotted parts of the semiconductor layer pattern are to be left in the subsequent removal step.

In the semiconductor layer pattern shown in FIG. 13a, the two long semiconductor layers between the long semiconductor layer of the driving transistor and the long semiconductor layer of the load transistor are removed. As a result, the distance between the center line of the long semiconductor layer of the driving transistor and the center line of the long semiconductor layer of the load transistor is three times as large as the minimum distance Rmin. Furthermore, for the adjacent access transistors between the unit areas adjacent to each other in the second direction (the lateral direction of the figure), one of the long semiconductor layers between the long semiconductor layers of the adjacent access transistors is removed. As a result, the distance between the center lines of the long semiconductor layers of the adjacent access transistor is twice as large as the minimum distance Rmin.

Figure 13B:
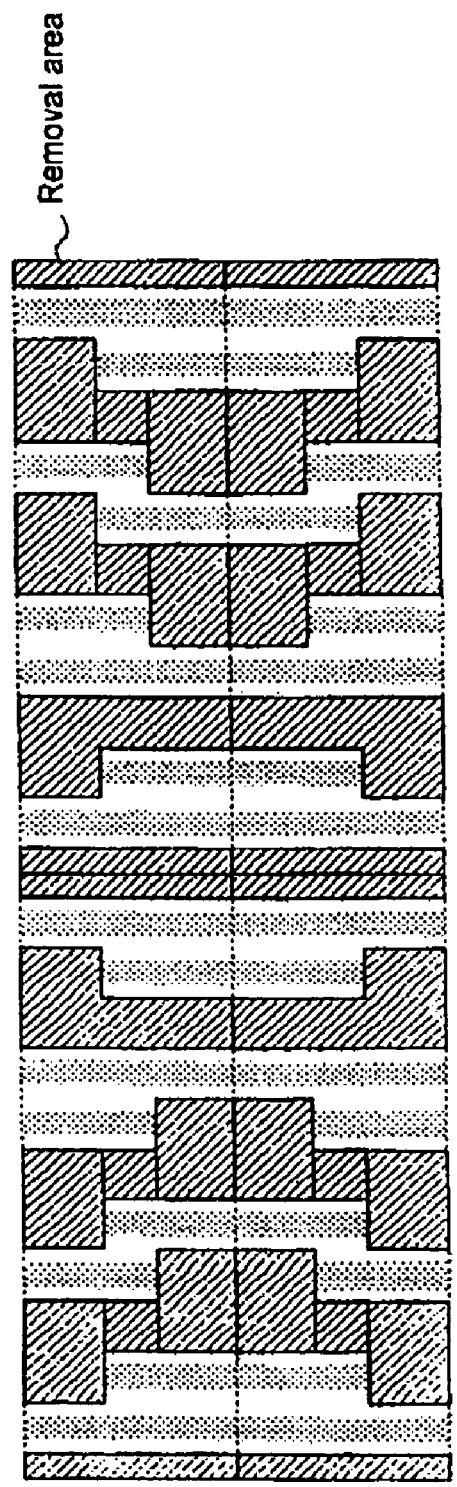
FIG. 13b is a diagram illustrating a method of manufacturing another SRAM structure according to the present invention.

In a semiconductor layer pattern shown in FIG. 13b, the two long semiconductor layers between the long semiconductor layer of the driving transistor and the long semiconductor layer of the load transistor are removed. As a result, the distance between the center line of the long semiconductor layer of the driving transistor and the center line of the long semiconductor layer of the load transistor is three times as large as the minimum distance Rmin. Furthermore, for the adjacent access transistors between the unit areas adjacent to each other in the second direction (the lateral direction of the figure), one of the long semiconductor layers between the long semiconductor layers of the adjacent access transistors is removed. As a result, the distance between the center lines of the long semiconductor layers of the adjacent access transistor is twice as large as the minimum distance Rmin.

As shown in the semiconductor layer pattern shown in FIG. 13a, the number of semiconductor layers in the areas covered with the shaded patterns can be appropriately changed. Thus adjusting the number of semiconductor layers allows each of the following distances to be an integral multiple of the minimum distance Rmin: the distance between the center lines of the driving transistor and the load transistor which are adjacent to each other, the distance between the center lines of the access transistor and the driving transistor, and the distance between the center lines of the semiconductor layers of the adjacent access transistors in the adjacent unit areas.

Furthermore, in an alternative variation, the SRAM cell can be constructed using an FIN FET having a multi-structure in which each FIN transistor includes a plurality of projecting semiconductor layers. For example, the driving transistor, the load transistor, and the access transistor each have two projecting semiconductor layers. The SRAM may be configured such that the driving transistor, the load transistor, and the access transistor each have three projecting semiconductor layers. Such a configuration can be formed using a process similar to that of the above-described manufacturing method.

Figure 13C:
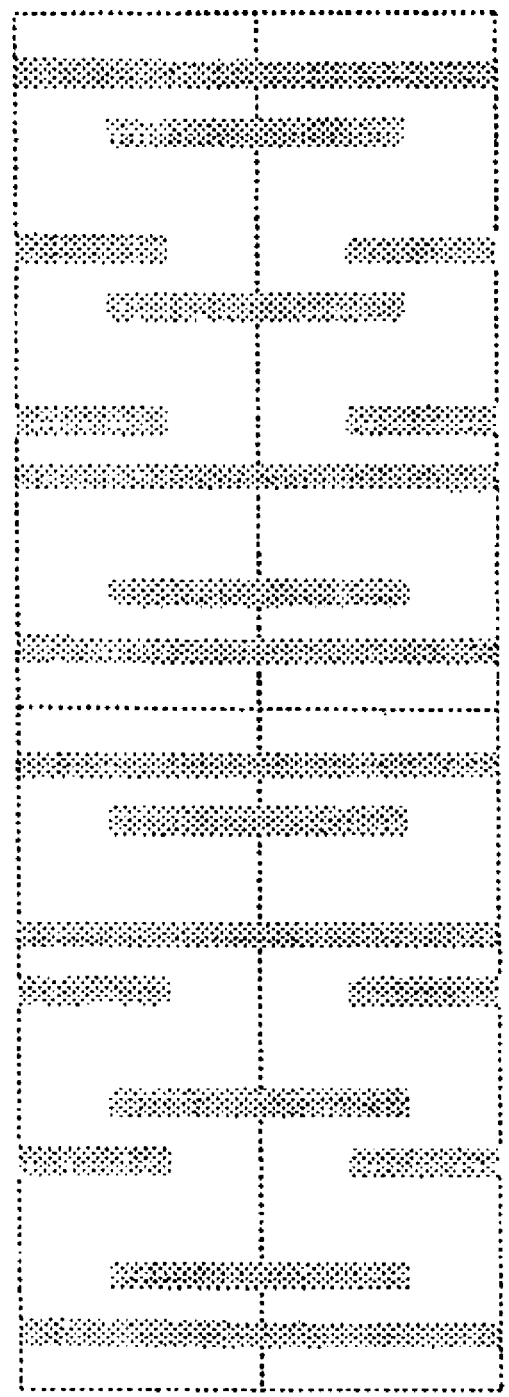
FIG. 13c is a diagram illustrating the method of manufacturing the SRAM structure according to the present invention.

Furthermore, the semiconductor pattern shown in FIG. 13b includes no second-direction pattern crossing the first-direction long semiconductor layers and is composed only of the striped pattern in which the long semiconductor layers are arranged at equal intervals all over the SRAM formation area. In FIG. 13b, a pattern (shaded parts) overlapping the original semiconductor pattern shows areas from which the semiconductor layer is removed. A SRAM structure shown in FIG. 13d can be formed by removing the unwanted parts from the semiconductor layer pattern to form a semiconductor layer pattern shown in FIG. 13c and then executing a process similar to that of the above-described manufacturing method.

Figure 13D:
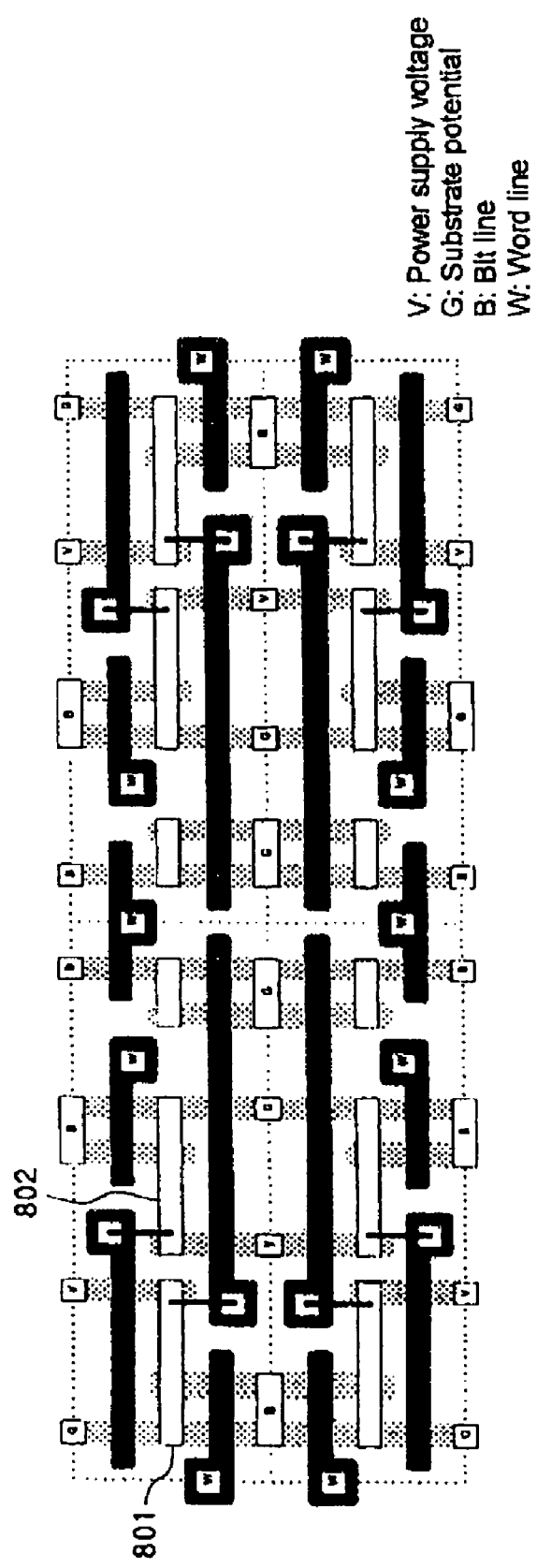
FIG. 13d is a diagram illustrating the method of manufacturing the SRAM structure according to the present invention.

In the SRAM structure shown in FIG. 13d, reference numeral 801 denotes a buried conductor wire connecting the drain of the driving transistor D2 to the drain of the load transistor L2. Reference numeral 802 denotes a buried conductor wire connecting the drain of the driving transistor D1 to the drain of the load transistor L1. The buried conductor wires are connected to the upper layer wires to serve as contact plugs for the accumulation nodes. The buried conductor wires can be formed by forming openings in the inter-layer insulating film along the second direction like grooves so as to expose the semiconductor layers to be connected together, in the openings, and then filling the openings with a conductive material.

[Other Examples of the SRAM Element Structure]

Figure 14:
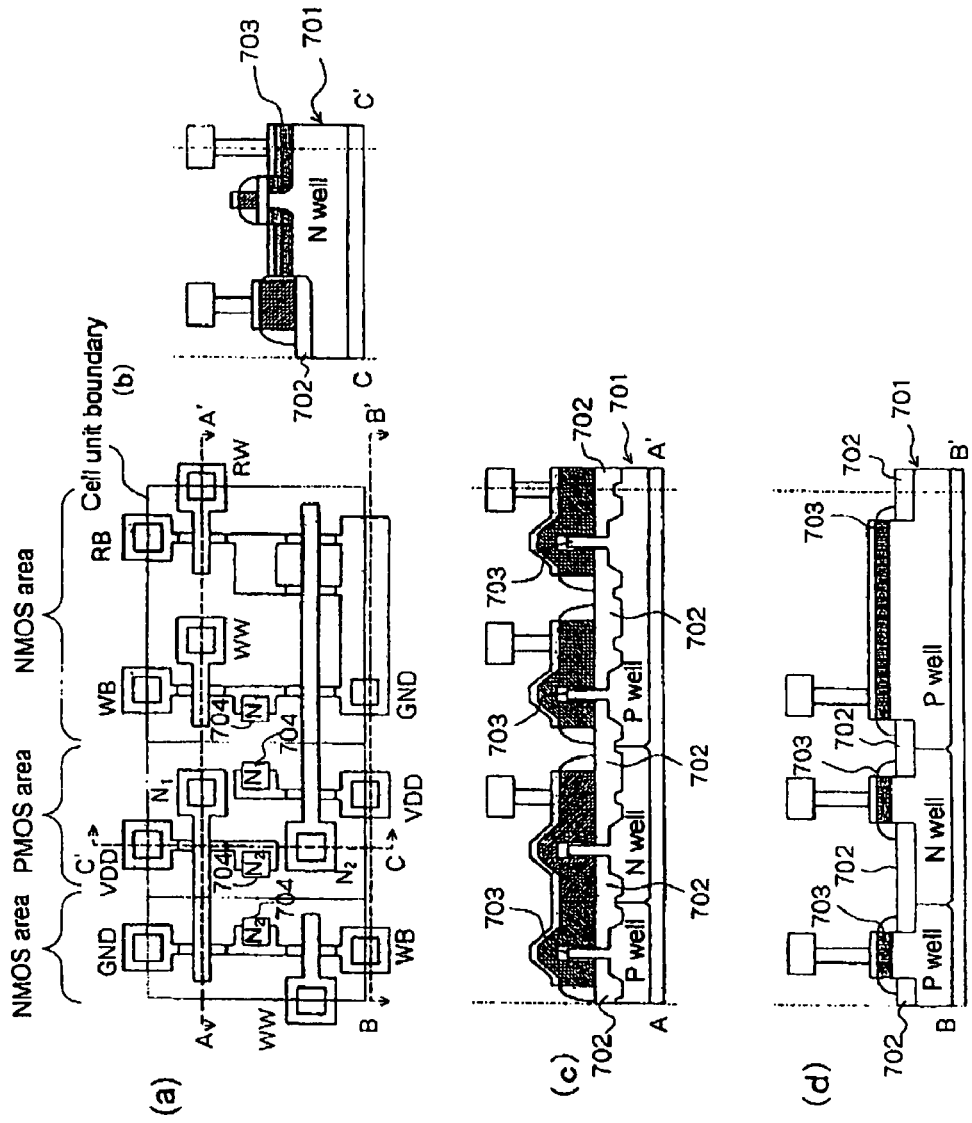
FIG. 14 is a diagram illustrating another element structure of the SRAM cell unit according to the present invention.

FIG. 14 shows another example of the SRAM cell unit. FIG. 14(a) is a plan view. FIG. 14(b) is a sectional view taken along line C-C'. FIG. 14(c) is a sectional view taken along line A-A'. FIG. 14(d) is a sectional view taken along line B-B'. In FIG. 14(a), the side wall insulating films are omitted, Vertical dashed lines in the right and left, respectively, of each of FIGS. 14(b) to 14(d) show the cell unit boundaries.

In the present exemplary embodiment, a bulk semiconductor substrate is used in place of the SOI substrate. The projecting semiconductor layer in the FIN FET is composed of a part of the bulk semiconductor substrate and projects upward from a surface of the separating insulating film provided on the semiconductor substrate. Furthermore, the semiconductor layer portion constituting the drain of the driving transistor is separated from the semiconductor layer portion constituting the drain of the load transistor. The accumulation node contact is connected to each of the semiconductor layer portions. Except for these points, the SRAM structure in the present exemplary embodiment is similar to that shown in FIGS. 6 and 7, described above.

As shown in FIGS. 14(a) to 14(C), a semiconductor layer pattern 703 in the present exemplary embodiment is integrated with a bulk semiconductor substrate 701 and composed of a part of the substrate 701. The semiconductor layer pattern 703 projects upward from a surface of a separating insulating film 702 provided on the semiconductor substrate 701. The periphery of projecting portions of the semiconductor layer pattern 703 is surrounded by the separating insulating film. That is, the separating insulating film 702 is provided on the entire semiconductor substrate except for the projecting semiconductor layer pattern. In the semiconductor substrate area under the semiconductor layer pattern and the separating insulating film, a P well is formed in the nMOS area, and an N well is formed in the pMOS area.

In the contact structure for the accumulation nodes in the present exemplary embodiment, as shown in FIG. 14(a), a contact plug 704 is connected to each of the semiconductor layer (n type) constituting the drain of the driving transistor and the semiconductor layer (p type) constituting the drain of the load transistor. The contact plugs 704 are connected together by the upper layer wire. If a pn junction is formed in the semiconductor layer to directly couple both drains together as shown in FIGS. 6 and 7, described above, the diffusion areas of the projecting semiconductor layers and the wells located under the projecting layers are short-circuited. Thus, in the present exemplary embodiment, the n-type semiconductor layer and p-type semiconductor layer constituting the drains are separated from each other by the separating insulating film 702. The separated semiconductor layers are connected together by the upper layer wire via the contact plugs 704, connected to the corresponding semiconductor layers.

The above-described configuration can be manufactured, for example, as described below.

A semiconductor substrate having a P well and an N well in predetermined areas, for example, a silicon substrate, is prepared. Ions are implanted in the silicon substrate as required, to form a channel area. Subsequently a cap insulating film is formed all over the top surface.

Figure 15:
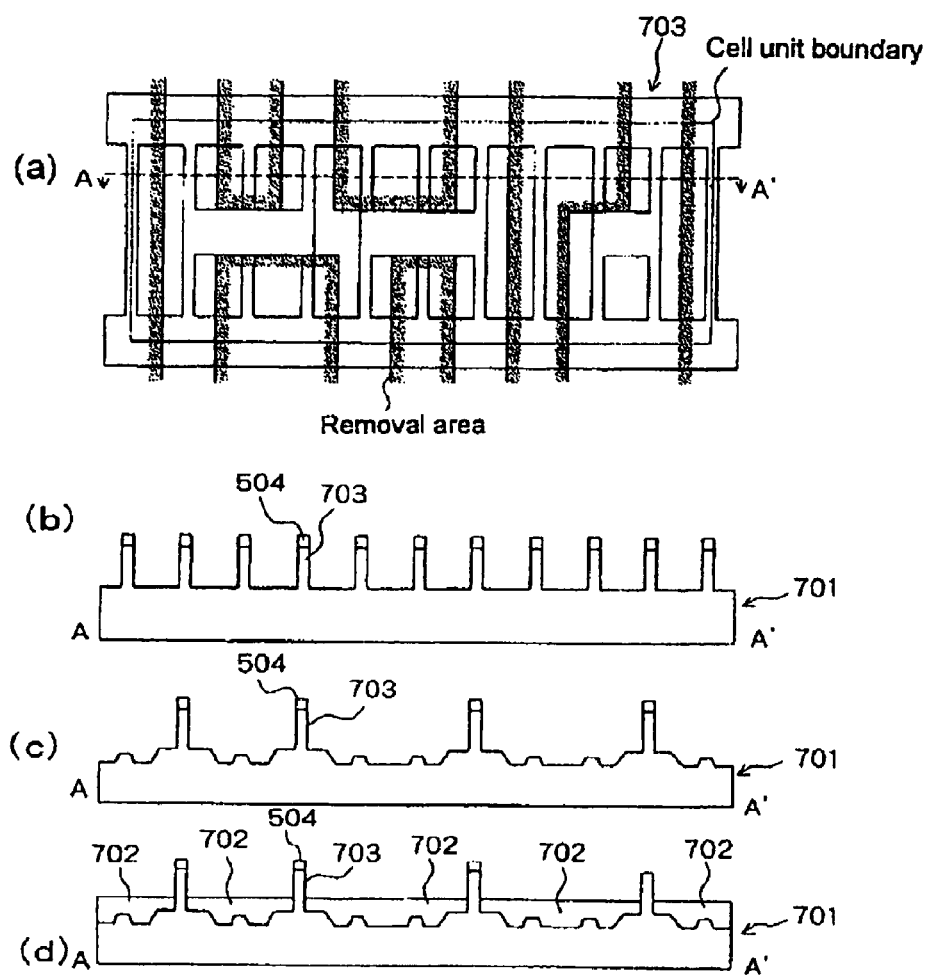
FIG. 15 is a diagram illustrating a method of manufacturing another SRAM structure according to the present invention.

Then, the silicon substrate and the cap insulating film formed thereon are patterned by photolithography and dry etching to form a semiconductor layer pattern including a striped pattern portion in which long semiconductor layers are arranged at equal intervals. This is shown in FIGS. 15(a) and 15(b). FIG. 15(a) is a plan view. FIG. 15(b) is a sectional view taken along line A-A'. Shaded areas in FIG. 15(a) show areas from which the semiconductor layer pattern is to be removed in the subsequent step.

Then, unwanted parts of the semiconductor layer pattern are removed by lithography and dry etching. This is shown in the sectional view in FIG. 15(c), taken along line A-A'.

Then, an insulating film is formed all over the top surface by deposition so as to bury the remaining part of the semiconductor layer pattern. The surface of the insulating film is then flattened by CMP (Chemical Mechanical Polishing). The insulating film is subsequently etched back to expose the top of the semiconductor layer pattern 703, and the separating insulating film 702 is consequently formed around the periphery of the semiconductor layer pattern. This is shown in the sectional view in FIG. 16(d), taken along line A-A'.

For the subsequent steps, the SRAM structure according to the present exemplary embodiment can be produced by a method similar to the one described above except for the steps relating to the contact structure for the accumulation nodes.

The invention claimed is:

1. A semiconductor device including a plurality of SRAM cell units, each of the SRAM cell units comprising:
a data holding section comprising a pair of a first driving transistor and a second driving transistor and a pair of a first load transistor and a second load transistor;
a data write section comprising a pair of a first access transistor and a second access transistor; and
a data read section comprising a third access transistor and a third driving transistor,
wherein:
each of the first driving transistor, second driving transistor, first load transistor, second load transistor, first access transistor, second access transistor, third access transistor, and third driving transistor comprises a semiconductor layer projecting upward from a base plane, a gate electrode extending from a top to opposite side surfaces of the semiconductor layer so as to stride the semiconductor layer, a gate insulating film interposed between the gate electrode and the semiconductor layer, and a pair of a source area and a drain area provided in the semiconductor layer,
a longitudinal direction of each of the semiconductor layers is provided along a first direction,
a longitudinal direction of each of the gate electrodes is perpendicular to the first direction, and
for all the corresponding transistors between the SRAM cell units adjacent to each other in the first direction, the semiconductor layer in one of the corresponding transistors is located on a center line of the semiconductor layer along the first direction in the other transistor.

2. The semiconductor device according to claim 1, wherein in the SRAM cell unit,
each of the semiconductor layers constituting the transistors is made of a semiconductor layer provided on an insulating layer, and
the first driving transistor comprises the semiconductor layer integrated with the semiconductor layer in the first access transistor and the semiconductor layer in the first load transistor, and the second driving transistor comprises the semiconductor layer integrated with the semiconductor layer in the second access transistor and the semiconductor layer in the second load transistor.

3. The semiconductor device according to claim 1, wherein each of the semiconductor layers constituting the transistors in the SRAM cell unit is made of a semiconductor layer provided on an insulating layer;
the SRAM cell unit includes, on the insulating layer,
a first semiconductor layer area integrated with the semiconductor layer in the first driving transistor, the semiconductor layer in the first load transistor, and the semiconductor layer in the first access transistor, the first semiconductor layer area including a junction between a first conductivity type area and a second conductivity type area, and
a second semiconductor layer area integrated with the semiconductor layer in the second driving transistor, the semiconductor layer in the second load transistor, and the semiconductor layer in the second access transistor, the second semiconductor layer area including a junction between a first conductivity type area and a second conductivity type area; and
a first node contact connected to the drain area of the first driving transistor and to a drain area of the first load transistor is connected onto the first semiconductor layer area, and the second node contact connected to a drain area of the second driving transistor and to a drain area of the second load transistor is connected onto the second semiconductor layer area.

4. The semiconductor device according to claim 1, wherein each of the semiconductor layers constituting the transistors in the SRAM cell unit is made of a part of a semiconductor substrate and projects from a top surface of a separating insulating film provided on the semiconductor substrate.

5. The semiconductor device according to claim 1, wherein in the SRAM cell unit,
the gate electrode of the first driving transistor, the gate electrode of the first load transistor, and the gate electrode of the third driving transistor are formed of a first wire along the second direction perpendicular to the first direction, and a gate electrode of the second driving transistor and a gate electrode of the second load transistor are formed of a second wire along the second direction, and
the gate electrode of the first access transistor is formed of a third wire located on a center line of the second wire along the second direction, and the gate electrode of the second access transistor is formed of a fourth wire located on a center line of the second wire along the second direction.

6. The semiconductor device according to claim 1, wherein a ground line contact connected to the source area of the first driving transistor, a power supply line contact connected to the source area of the first load transistor, and a bit line contact connected to the source/drain area of the second access transistor are arranged on one line of one cell unit boundary along the second direction, and
a ground line contact connected to the source area of the second driving transistor, a power supply line contact connected to the source area of the second load transistor, and a bit line contact connected to the source/drain area of the first access transistor are arranged on one line of the other cell unit boundary along the second direction.

7. The semiconductor device according to claim 6, wherein each of the ground line contacts, the power supply line contacts, and the bit line contacts has a second-direction width greater than that of the semiconductor layer under the gate electrode, and is connected onto a pad semiconductor layer integrated with the semiconductor layer.

8. The semiconductor device according to claim 1, wherein the adjacent SRAM cell units are in a mirror image relationship with respect to the cell unit boundary serving as a symmetry axis.

9. The semiconductor device according to claim 1, wherein the semiconductor layers have an equal width in the second direction which is parallel to the base plane.

10. A semiconductor device including a plurality of SRAM cell units, each of the SRAM cell units comprising:
a data holding section comprising a pair of a first driving transistor and a second driving transistor and a pair of a first load transistor and a second load transistor;
a data write section comprising a pair of a first access transistor and a second access transistor; and
a data read section comprising a third access transistor and a third driving transistor,
wherein:
each of the first driving transistor, second driving transistor, first load transistor, second load transistor, first access transistor, second access transistor, third access transistor, and third driving transistor comprises a semiconductor layer projecting upward from a base plane, a gate electrode extending from a top to opposite side surfaces of the semiconductor layer so as to stride the semiconductor layer, a gate insulating film interposed between the gate electrode and the semiconductor layer, and a pair of a source area and a drain area provided in the semiconductor layer;

the semiconductor layers are arranged such that a longitudinal direction of each of the semiconductor layers is provided along a first direction and a distance between center lines of the semiconductor layers along the first direction is an integral multiple of a minimum one of the distances between the center lines;

the semiconductor layers have an equal width in a second direction which is parallel to the base plane and is perpendicular to the first direction;

a longitudinal direction of each of the gate electrodes is perpendicular to the first direction; and for all the corresponding transistors between the SRAM cell units adjacent to each other in the first direction, the semiconductor layer in one of the corresponding transistors is located on a center line of the semiconductor layer along the first direction in the other transistor.

11. The semiconductor device according to claim 10, wherein in the SRAM cell unit,
the first driving transistor comprises the semiconductor layer located on the center line of the semiconductor layer along the first direction in the first access transistor, and the second driving transistor comprises the semiconductor layer located on the center line of the semiconductor layer along the first direction in the second access transistor;
the first load transistor comprises the semiconductor layer adjacent to the semiconductor layer in the first driving transistor, and the second load transistor comprises the semiconductor layer adjacent to the semiconductor layer in the second driving transistor; and
the first load transistor and the second load transistor are arranged such that the distance between the center line of the semiconductor layer in the first load transistor and the center line of the semiconductor layer in the second load transistor is equal to the minimum distance.

12. The semiconductor device according to claim 10, wherein in the SRAM cell unit,
the first load transistor comprises the semiconductor layer located on the center line of the semiconductor layer along the first direction in the first access transistor, and the second load transistor comprises the semiconductor layer located on the center line of the semiconductor layer along the first direction in the second access transistor;
the first driving transistor comprises the semiconductor layer adjacent to the semiconductor layer in the first load transistor, and the second driving transistor comprises the semiconductor layer adjacent to the semiconductor layer in the second load transistor; and
the first driving transistor and the second driving transistor are arranged such that the distance between the center line of the semiconductor layer in the first driving transistor and the center line of the semiconductor layer in the second driving transistor is equal to the minimum distance.

13. The semiconductor device according to claim 10, wherein
the distance between the center lines of the adjacent semiconductor layers in the first driving transistor and the first load transistor, the center lines being along the first direction is at least twice as large as the minimum distance; and
the distance between the center lines of the adjacent semiconductor layers in the second driving transistor and the second load transistor, the center lines being along the first direction is at least twice as large as the minimum distance.

14. The semiconductor device according to claim 10, wherein
the access transistor in one of the SRAM cell units adjacent to each other in a second direction is located adjacent to the access transistor in the other SRAM cell unit; and
the distance between the center line of the semiconductor layer along the first direction in one of the access transistors and the center line of the semiconductor layer along the first direction in the other access transistor is at least twice as large as the minimum distance.

15. The semiconductor device according to claim 10, wherein each of the semiconductor layers constituting the transistors in the SRAM cell unit is made of a semiconductor layer provided on an insulating layer.

16. The semiconductor device according to claim 15, wherein in the SRAM cell unit, the first driving transistor comprises the semiconductor layer integrated with the semiconductor layer in the first access transistor and the semiconductor layer in the first load transistor, and the second driving transistor comprises the semiconductor layer integrated with the semiconductor layer in the second access transistor and the semiconductor layer in the second load transistor.

17. The semiconductor device according to claim 15, wherein
the SRAM cell unit includes, on the insulating layer,
a first semiconductor layer area integrated with the semiconductor layer in the first driving transistor, the semiconductor layer in the first load transistor, and the semiconductor layer in the first access transistor, the first semiconductor layer area including a junction between a first conductivity type area and a second conductivity type area, and
a second semiconductor layer area integrated with the semiconductor layer in the second driving transistor, the semiconductor layer in the second load transistor, and the semiconductor layer in the second access transistor, the second semiconductor layer area including a junction between a first conductivity type area and a second conductivity type area; and
a first node contact connected to a drain area of the first driving transistor and to a drain area of the first load transistor is connected onto the first semiconductor layer area, and a second node contact connected to a drain area of the second driving transistor and to a drain area of the second load transistor is connected onto the second semiconductor layer area.

* * * * *